(12) United States Patent
Ohtani et al.

(10) Patent No.: US 6,452,211 B1
(45) Date of Patent: Sep. 17, 2002

(54) SEMICONDUCTOR THIN FILM AND SEMICONDUCTOR DEVICE

(75) Inventors: Hisashi Ohtani, Kanagawa; Shunpei Yamazaki, Tokyo; Jun Koyama, Kanagawa; Yasushi Ogata, Kanagawa; Akiharu Miyanaga, Kanagawa, all of (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/095,027

(22) Filed: Jun. 9, 1998

(30) Foreign Application Priority Data

Jun. 10, 1997 (JP) .............................. 9-168022

(51) Int. Cl.$^7$ ..................... H01L 29/04; H01L 31/36; H01L 29/76
(52) U.S. Cl. ................ 257/64; 257/65; 257/66; 257/347; 148/DIG. 122
(58) Field of Search .................... 257/49–50, 52–55, 257/61–65; 148/347, DIG. 12

(56) References Cited

U.S. PATENT DOCUMENTS

| | | | |
|---|---|---|---|
| 3,915,660 A | * 10/1975 | Keller et al. | 23/301 |
| 4,766,477 A | 8/1988 | Nakagawa et al. | |
| 5,221,365 A | * 6/1993 | Noguchi et al. | 136/258 |
| 5,315,132 A | 5/1994 | Yamazaki | |
| 5,378,289 A | * 1/1995 | Noguchi et al. | 136/258 |
| 5,543,636 A | 8/1996 | Yamazaki | |
| 5,605,846 A | 2/1997 | Ohtani | |
| 5,619,054 A | * 4/1997 | Hashimoto | 257/347 |
| 5,643,826 A | 7/1997 | Ohtani et al. | |
| 5,648,277 A | 7/1997 | Zhang et al. | |
| 5,712,191 A | 1/1998 | Nakajima | |
| 5,858,823 A | 1/1999 | Yamazaki | |
| 5,882,960 A | 3/1999 | Zhang et al. | |
| 5,895,933 A | 4/1999 | Zhang et al. | |

(List continued on next page.)

FOREIGN PATENT DOCUMENTS

| | | |
|---|---|---|
| JP | 57-160121 | 10/1982 |
| JP | 07-130652 | 5/1995 |
| JP | 07-135318 | 5/1995 |
| JP | 07-321339 | 12/1995 |
| JP | 08-078329 | 3/1996 |
| JP | 08-139019 | 5/1996 |

OTHER PUBLICATIONS

C.C. Tsai et al., Amorphous Si prepared in a UHV plasma deposition system, Journal of Non–cystalline Solids 59 & 60 (1983) 731–734.*

Ohtani et al., "LP–B: Late–News Poster: A 60–in. HDTV Rear–Projector with Continuous–Grain Silicon Technology", May 17–22, 1998, pp. 467–470, SID 98 Digest, International Symposium Digest of Technical Papers, vol. XXIX.

Primary Examiner—Jerome Jackson, Jr.
Assistant Examiner—Shrinivas H. Rao
(74) Attorney, Agent, or Firm—Eric J. Robinson; Robinson Intellectual Property Law Office, PC

(57) ABSTRACT

A semiconductor thin film having extremely superior crystallinity and a semiconductor device using the semiconductor thin film having high performance are provided. The semiconductor thin film is manufactured in such a manner that after an amorphous semiconductor thin film is crystallized by using a catalytic element, a heat treatment is carried out in an atmosphere containing a halogen element to remove the catalytic element. The thus obtained crystalline semiconductor thin film has substantially {110} orientation. The concentration of C, N, and S remaining in the final semiconductor thin film is less than $5 \times 10^{18}$ atoms/cm$^3$, and the concentration of O is less than $1.5 \times 10^{19}$ atoms/cm$^3$.

43 Claims, 18 Drawing Sheets

U.S. PATENT DOCUMENTS

| | | |
|---|---|---|
| 5,923,962 A | 7/1999 | Ohtani et al. |
| 5,923,968 A | 7/1999 | Yamazaki et al. |
| 5,942,768 A | 8/1999 | Zhang |
| 5,956,581 A | 9/1999 | Yamazaki |
| 6,037,610 A | 3/2000 | Zhang |
| 6,048,758 A | 4/2000 | Yamazaki |
| 6,077,731 A | 6/2000 | Yamazaki |
| 6,107,639 A * | 8/2000 | Yamazaki et al. ............ 257/49 |
| 6,140,667 A * | 10/2000 | Yamazaki et al. ............ 257/59 |
| 6,204,099 B1 | 3/2001 | Kusumoto |
| 6,211,536 B1 | 4/2001 | Zhang |

* cited by examiner

5μm

5μm

FIG. 3A
FIG. 3B
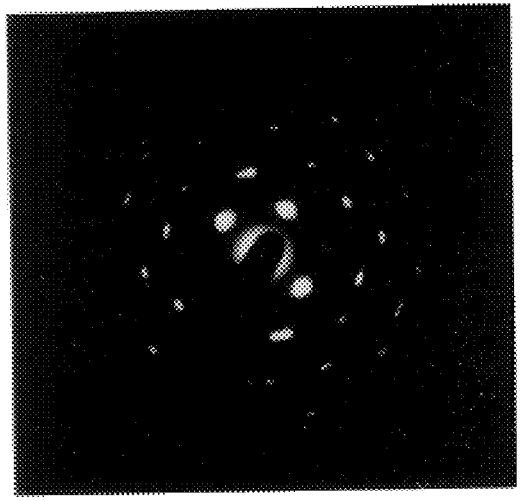
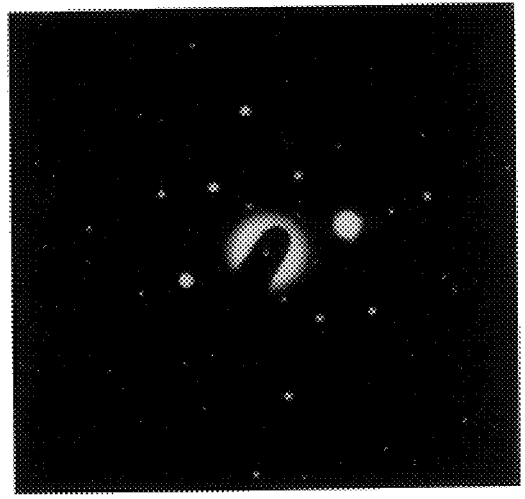
FIG. 3C
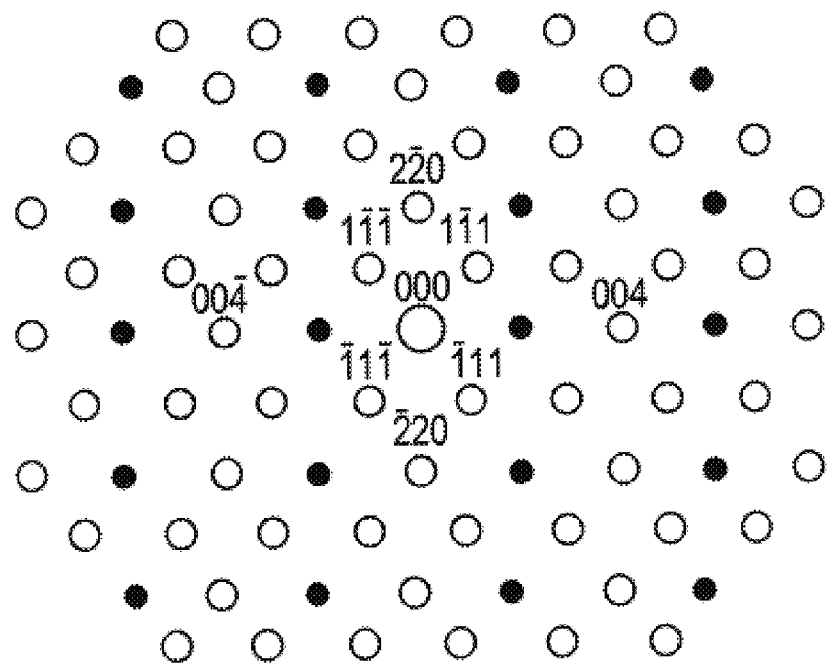

HEAT TREATMENT FOR CRYSTALLIZATION

GETTERING PROCESS OF CATALYTIC ELEMENT

GETTERING PROCESS OF CATALYTIC ELEMENT

HEAT TREATMENT FOR CRYSTALLIZATION

GETTERING PROCESS OF CATALYTIC ELEMENT

ADDITION OF IMPURITY IONS FOR GIVING N-TYPE
(FORMATION OF n⁻ REGION AND n⁺ REGION)

ADDITION OF IMPURITY ION FOR GIVING P-TYPE
(FORMATION OF P⁻ REGION AND P⁺ REGION)

CMOS CIRCUIT | PIXEL MATRIX CIRCUIT

CMOS CIRCUIT | PIXEL MATRIX CIRCUIT

CMOS CIRCUIT | PIXEL MATRIX CIRCUIT

PERIPHERAL CIRCUIT (CMOS CIRCUIT) | PIXEL MATRIX CIRCUIT

FIG. 19A
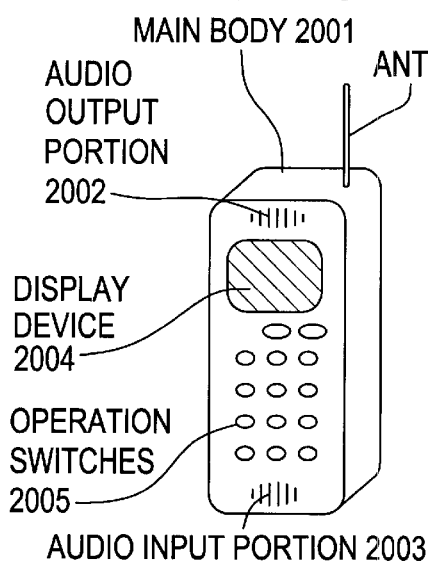
MAIN BODY 2001
AUDIO OUTPUT PORTION 2002
ANTENNA 2006
DISPLAY DEVICE 2004
OPERATION SWITCHES 2005
AUDIO INPUT PORTION 2003

FIG. 19B
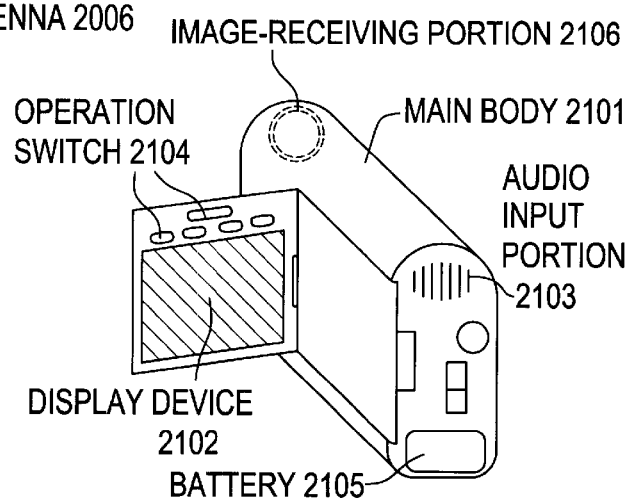
IMAGE-RECEIVING PORTION 2106
MAIN BODY 2101
OPERATION SWITCH 2104
AUDIO INPUT PORTION 2103
DISPLAY DEVICE 2102
BATTERY 2105

FIG. 19C
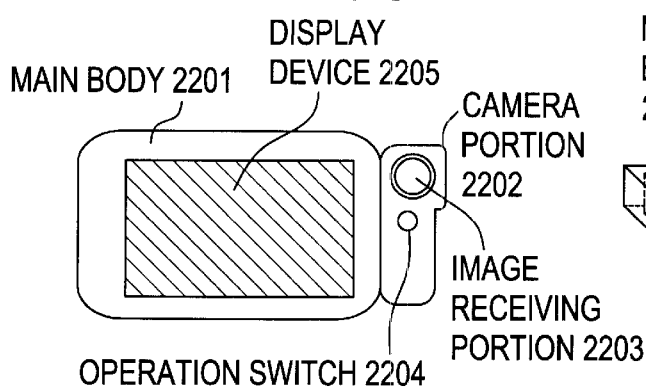
MAIN BODY 2201
DISPLAY DEVICE 2205
CAMERA PORTION 2202
IMAGE RECEIVING PORTION 2203
OPERATION SWITCH 2204

FIG. 19D
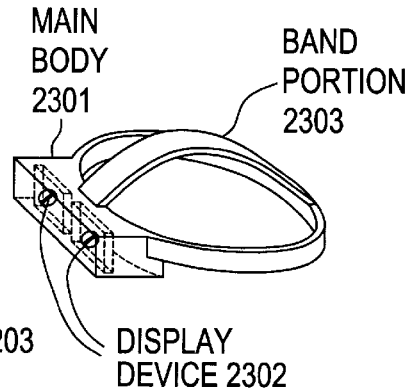
MAIN BODY 2301
BAND PORTION 2303
DISPLAY DEVICE 2302

FIG. 19E
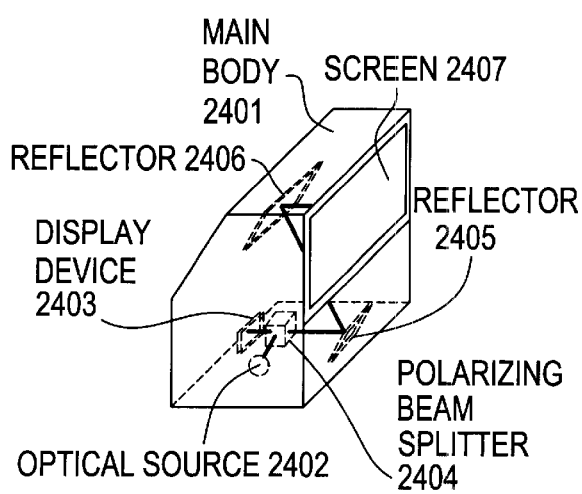
MAIN BODY 2401
SCREEN 2407
REFLECTOR 2406
DISPLAY DEVICE 2403
REFLECTOR 2405
OPTICAL SOURCE 2402
POLARIZING BEAM SPLITTER 2404

FIG. 19F
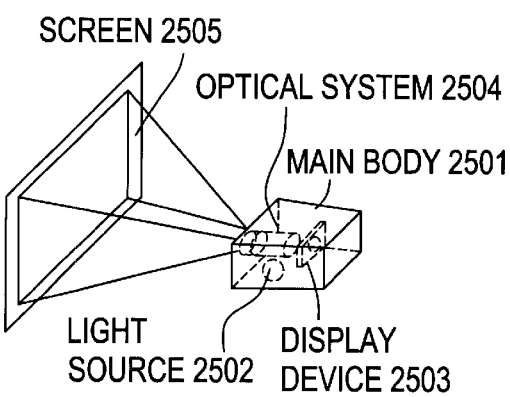
SCREEN 2505
OPTICAL SYSTEM 2504
MAIN BODY 2501
LIGHT SOURCE 2502
DISPLAY DEVICE 2503

SEMICONDUCTOR THIN FILM AND SEMICONDUCTOR DEVICE

BACKGROUND OF THE INVENTION

1. Field of the Invention

The present invention relates to a semiconductor thin film formed on a substrate having an insulating surface, and a semiconductor device having the semiconductor thin film as an active layer. Particularly, the present invention relates to a structure in a case where a material containing silicon as the main ingredient is used for the semiconductor thin film.

2. Description of the Related Art

In recent years, attention is paid to a technique to constitute a thin film transistor (TFT) using a semiconductor thin film (with a thickness of about several hundreds to several thousands Å) formed on a substrate having an insulating surface. A thin film transistor is widely used for electric devices such as an IC or an electrooptical device, and particularly, speedy development is required for a thin film transistor as a switching element for a picture display device.

For example, in a liquid crystal display device, trials are made to apply TFTs to all electric circuits such as a pixel matrix circuit for controlling each of pixel regions arranged in matrix, a driving circuit for controlling the pixel matrix circuit, and a logic circuit (processor circuit, memory circuit, etc.) for processing data signals from the outside.

In the present circumstances, although a TFT using a noncrystalline silicon film (amorphous silicon film) as an active layer has been put into practical use, a TFT using a crystalline silicon film (polysilicon film, polycrystalline silicon film, etc.) is needed for an electric circuit requiring further high speed performance, such as a driving circuit and a logic circuit.

For example, as a method of forming a crystalline silicon film on a glass substrate, techniques disclosed in Japanese Patent Unexamined Publication Nos. Hei. 7-130652 and Hei. 8-78329 by the same assignee as the present application are well known. The techniques disclosed in these publications enable the formation of a crystalline silicon film superior in crystallinity by using a catalytic element for promoting crystallization of an amorphous silicon film and by a heat treatment at a temperature of 500° C. to 600° C. for about 4 hours.

Especially, the technique disclosed in Japanese Patent Unexamined Publication No. Hei. 8-78329 causes crystal growth almost parallel to the surface of a substrate by applying the above-mentioned technique, and the present inventors refer to the formed crystallized region especially as a horizontal growth region (or a lateral growth region).

However, even if a driving circuit is constructed by using such a TFT, it still does not completely satisfy the required performance. Especially, under the present circumstances, it is impossible to constitute a high speed logic circuit requiring an extremely high speed operation in such a range of from MHz to GHz by a conventional TFT.

The present inventors have made various trials for improving crystallinity of a crystalline silicon film (called a polycrystalline silicon film) including crystal grain boundaries. Semi-amorphous semiconductor (Japanese Patent Unexamined Publication No. Sho. 57-160121), monodomain semiconductor (Japanese Patent Unexamined Publication No. Hei. 8-139019) and the like can be cited.

The concept common to the semiconductor film disclosed in the above-mentioned publications is to make crystal grain boundaries substantially harmless. That is, the most important object is to substantially eliminate the crystal grain boundaries to cause smooth movement of carriers (electrons or holes).

However, even by the semiconductor film disclosed in the above-mentioned publications, it is insufficient to perform high speed operation required by a logic circuit. That is, in order to realize a system-on-panel having a built-in logic circuit, the development of a completely new material, which has not conventionally existed, has been demanded.

SUMMARY OF THE INVENTION

The present invention has been made in response to such a demand, and an object of the present invention is therefore to provide a semiconductor thin film for realizing such a semiconductor device having extremely high performance, as can constitute a high speed logic circuit, which can not be manufactured by a conventional TFT. Another object of the present invention is to provide a semiconductor device using such a semiconductor thin film.

According to an aspect of the present invention, a semiconductor thin film is made of an aggregate of a plurality of rod-like or flattened rod-like crystals containing silicon as the main ingredient, the thin film has substantially plane orientation of {110}, and one kind or plural kinds of elements selected from the group except at least C (carbon), N (nitrogen), O (oxygen), and S (sulfur) exist in the film in addition to silicon.

According to another aspect of the present invention, in the above semiconductor thin film, the element existing in the film in addition to silicon is one kind or plural kinds of elements selected from the group consisting of Ni (nickel), Co (cobalt), Fe (iron), Pd (palladium), Pt (Platinum), Cu (copper), and Au (gold), and the concentration of the element is not larger than $5\times10^{17}$ atoms/cm$^3$ (or not larger than 0.001 atomic %).

Incidentally, since the concentration of silicon is about $5\times10^{22}$ atoms/cm$^3$ in a semiconductor film consisting of only pure silicon, the impurity element of $5\times10^{17}$ atoms/cm$^3$ is equivalent to the existence with a concentration of about 0.001 atomic %. Thus, for example, in a semiconductor thin film in which germanium of several % is contained in silicon, although the expression by "atomic %" is slightly changed, the absolute concentration of $5\times10^{17}$ atoms/cm$^3$ is not changed.

In the present specification, the concentration of each element is expressed by using measurement results by SIMS (Secondary Ion Mass Spectroscopy). Incidentally, the concentration of each element contained in a film is defined by the minimum value obtained from SIMS measurement results. However, the concentration in a region where measurement errors are large, such as in a film interface, is not considered as the measurement results.

As described above, the semiconductor thin film of the present invention is characterized in that there are no or substantially no elements of C (carbon), N (nitrogen), O (oxygen), and S (sulfur), which obstruct crystallization. This is a structure which can be achieved by complete impurity (pollution) management.

Although detailed description will be made in embodiments, the semiconductor thin film of the present invention contains silicon as the main ingredient, and its state is transformed from an amorphous state to a crystalline state. At the crystallization, such a catalytic element as described above is used.

However, it has been found through experiments by the present inventors that if at least any one element of C (carbon), N (nitrogen), O (oxygen), and S (sulfur) exists in the film, a bad influence is exerted upon the crystallization mechanism using the catalytic element.

As a typical mixing path of C (carbon), N (nitrogen), O (oxygen), and S (sulfur), the time of film formation of an amorphous film on a substrate can be cited. Thus, it is important to suppress the concentration of these impurity elements at the initial film formation as low as possible (preferably to completely remove) for securing excellent crystallinity. Of course, it is needless to say that care should be paid at any time other than the film formation.

In the present invention, since the mixing of C (carbon), N (nitrogen), O (oxygen), and S (sulfur) at the film formation of an amorphous film is thoroughly avoided, the above-described concentration of the impurities contained in the final semiconductor thin film (for example, in the state where the semiconductor thin film is incorporated in a completed semiconductor device) inevitably becomes very low.

The present inventors consider that it is important to manage such that, in the final semiconductor thin film, the concentration of C (carbon), N (nitrogen) and S (sulfur) is less than $5 \times 10^{18}$ atoms/cm$^3$ (less than 0.01 atomic %), and the concentration of O (oxygen) is less than $1.5 \times 10^{19}$ atoms/cm$^3$ (less than 0.03 atomic %).

Moreover, the present inventors consider that it is necessary to make preferably such a state that the concentration of C (carbon), N (nitrogen), O (oxygen), and S (sulfur) existing in the final semiconductor thin film is not larger than the detection lower limit of the SIMS analysis, and to make more preferably such a state that any of those elements do not exist at all, in order to obtain superior crystallinity.

BRIEF DESCRIPTION OF THE DRAWINGS

FIGS. 3A to 3C are photographs and a schematic view showing electron beam diffraction patterns.

FIGS. 19A to 19F are views showing examples of electronic devices (applied products).

DETAILED DESCRIPTION OF THE PREFERRED EMBODIMENTS

Figure 1A:
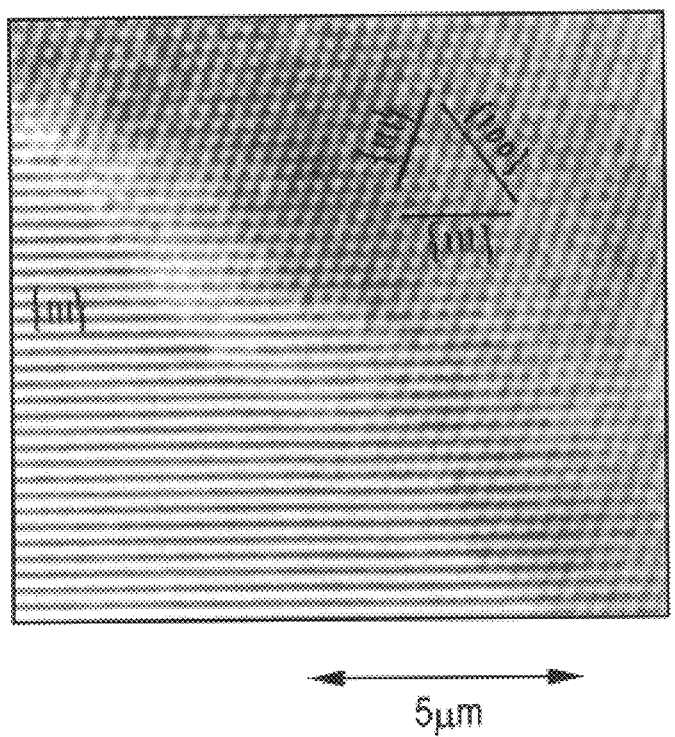
FIGS. 1A and 1B are HR-TEM photographs showing magnified crystal grain boundaries of semiconductor thin films.

Preferred embodiments of the present invention will be described in detail below.

Embodiment 1

In this embodiment, manufacturing steps of a semiconductor thin film of the present invention and a semiconductor device (specifically a TFT) having an active layer of the semiconductor thin film will be described. After the description of the manufacturing steps, findings obtained from the viewpoint of crystal structure and electric characteristics with respect to the TFT of the present invention will be described.

First, a quartz substrate 801 (see FIG. 8A) is prepared as a substrate having an insulating surface. Instead of the quartz substrate, a silicon substrate on which a thermal oxidation film is formed may be used. Moreover, such a method may be adopted that an amorphous silicon film is temporarily formed on a quartz substrate and the film is completely thermal oxidized to form an insulating film. In addition, a quartz substrate, a ceramic substrate, or a silicon substrate, each having a silicon nitride film as an insulating film, may be used.

Reference numeral 802 denotes an amorphous silicon film, and adjustment is made so that a final film thickness (film thickness taken a film decrease after thermal oxidation into consideration) becomes 10 to 75 nm (preferably 15 to 45 nm). The film formation is made by a low pressure CVD under the following conditions:

film formation temperature: 465° C.;
film formation pressure: 0.5 torr;
film formation gas: He (helium) 300 sccm;
$Si_2H_6$ (disilane) 250 sccm.

It is important to thoroughly manage the concentration of impurities in a film at the film formation. In this embodiment, management is made so that the concentration of each of C (carbon), N (nitrogen), and S (sulfur) in the amorphous silicon film 802, which is an impurity to obstruct crystallization, is less than $5 \times 10^{18}$ atoms/cm$^3$, and the concentration of O (oxygen) is less than $1.5 \times 10^{19}$ atoms/cm$^3$.

It is because if the concentration of each impurity exceeds the above value, the impurity has a bad influence at crystallization to degrade the film quality after the crystallization.

Dry cleaning is periodically carried out for a low pressure CVD furnace used in this embodiment to clean a film formation chamber. The dry cleaning is carried out such that a $ClF_3$ (chlorine fluoride) gas of 100 to 300 sccm is flown into a furnace heated up to about 200 to 400° C., and cleaning of the film formation chamber is carried out by fluorine produced by pyrolysis.

When the temperature of the furnace was made 300° C., and the flow rate of $ClF_3$ (chlorine fluoride) gas was made 300 sccm, an accretion (mainly composed of silicon) with a thickness of about 2 $\mu$m was completely removed in 4 hours.

The concentration of hydrogen in the amorphous silicon film 802 is also a very important parameter, and it appears that as the hydrogen content is made low, a film with superior crystallinity is obtained. Thus, it is preferable to form the amorphous silicon film 802 by the low pressure CVD method. A plasma CVD method may be used if the film formation condition is optimized.

Next, the amorphous silicon film 802 is crystallized. A technique disclosed in Japanese Patent Unexamined Publication No. Hei. 7-130652 by the present inventors is used as a means for crystallization. Although any means of embodiment 1 and embodiment 2 disclosed in the publication may be used, in the present invention, it is preferable to use the technical contents (described in detail in Japanese Patent Unexamined Publication No. Hei. 8-78329) set forth in the embodiment 2.

According to the technique disclosed in Japanese Patent Unexamined Publication No. Hei. 8-78329, a mask insulating film 803 for selecting an added region of a catalytic element is first formed. The mask insulating film 803 has a plurality of openings for adding the catalytic element. The positions of the openings can determine the positions of crystal regions.

Figure 8A:
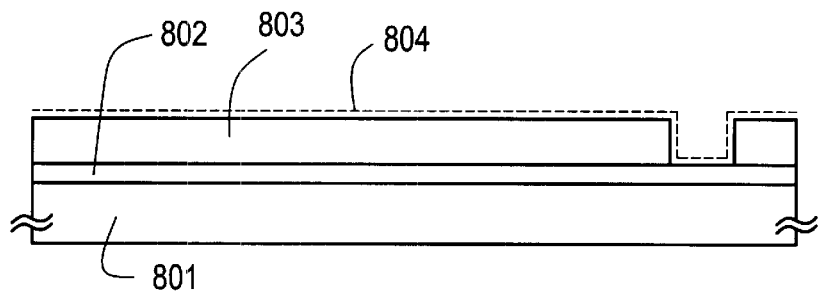
FIGS. 8A to 8E are views showing manufacturing steps of a thin film transistor.

As the catalytic element for promoting the crystallization of the amorphous silicon film, a solution containing nickel (Ni) is applied by a spin coating method to form a Ni contained layer 804. As the catalytic element, cobalt (Co), iron (Fe), palladium (Pd), platinum (Pt), copper (Cu), gold (Au) or the like may be used other than nickel (FIG. 8A).

As the addition step of the above-mentioned catalytic element, an ion implantation method or a plasma doping method using a resist mask may also be used. In this case, since it becomes easy to decrease an occupied area of an added region and to control a growth distance of a lateral growth region, the method becomes an effective technique when a minute circuit is formed.

Next, after the addition step of the catalytic element is ended, hydrogen is extracted under the condition of about 450° C. and 1 hour, and then a heat treatment is carried out in an inert gas atmosphere, a hydrogen atmosphere, or an oxygen atmosphere at a temperature of 500 to 700° C. (typically 550 to 650° C.) for 4 to 24 hours to crystallize the amorphous silicon film 802. In this embodiment, a heat treatment is carried out in a nitrogen atmosphere, at 570° C., and for 14 hours.

Figure 8B:
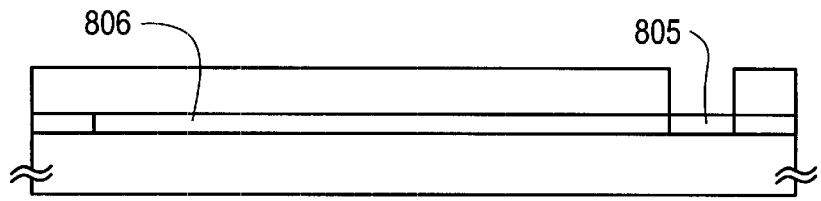

At this time, crystallization of the amorphous silicon film 802 proceeds first from nuclei produced in a region 805 added with nickel, and a crystal region 806 grown in almost parallel to the surface of the substrate 801 is formed. The present inventors refer to this crystal region 806 as a lateral growth region. The lateral growth region has an advantage that the total crystallinity is superior since respective crystals are gathered in a comparatively uniform state (FIG. 8B).

Incidentally, even in the case where the technique set forth in embodiment 1 of the above-mentioned Japanese Patent Unexamined Publication No. Hei. 7-130652 is used, a region which can be called a lateral growth region is microscopically formed. However, since the production of nuclei occurs irregularly in the surface, it is difficult to control the crystal grain boundaries.

After the heat treatment for crystallization is ended, the mask insulating film 803 is removed and patterning is carried out, so that an island-like semiconductor layer (active layer) 807 made up of only the lateral growth region 806 is formed.

Next, a gate insulating film 808 made of an insulating film containing silicon is formed. It is sufficient if the film thickness of the gate insulating film 808 is adjusted in the range of 20 to 250 nm with consideration of an increase due to a subsequent thermal oxidation step. Vapor phase methods such as plasma CVD, sputtering and the like may be employed for film formation.

Figure 8C:
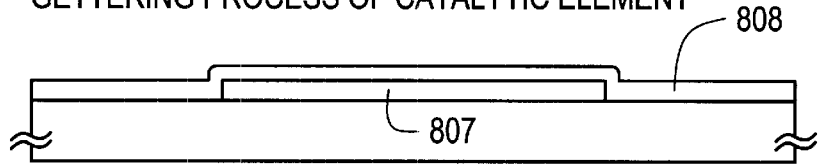

Next, as shown in FIG. 8C, a heat treatment (gettering process of the catalytic element) for removing or reducing the catalytic element (nickel) is carried out. In this heat treatment, a halogen element is made contained in a processing atmosphere and the gettering effect of a metal element by the halogen element is used.

In order to sufficiently obtain the gettering effect by the halogen element, it is preferable to carry out the above heat treatment at a temperature exceeding 700° C. If the temperature is not higher than 700° C., it becomes difficult to decompose a halogen compound in the processing atmosphere, so that there is a fear that the gettering effect can not be obtained.

Thus, in this embodiment, the heat treatment is carried out at a temperature exceeding 700° C., preferably 800 to 1000° C. (typically 950° C.), and a processing time is 0.1 to 6 hours, typically 0.5 to 1 hour.

In this embodiment, an example is shown in which a heat treatment is carried out in an oxygen atmosphere containing hydrogen chlorine (HCl) of 0.5 to 10 vol % (in this embodiment, 3 vol %) at 950° C. for 30 minutes. If the concentration of HCl is higher than the above-mentioned concentration, the roughness comparable to a film thickness is produced on the surface of the active layer 807. Thus, that is not preferable.

Although an example is shown in which the HCl gas is used as a compound containing a halogen element, one kind or plural kinds of gases selected from compounds containing halogen such as typically HF, $NF_3$, HBr, $Cl_2$, $ClF_3$, $BCl_3$, $F_2$, and $Br_2$ may be used other than the HCl gas.

In this step, it is conceivable that nickel is removed in such a manner that nickel in the active layer 807 is gettered by the action of chlorine and is transformed into volatile nickel chloride which is released into the air. By this step, the concentration of nickel in the active layer 807 is lowered down to $5 \times 10^{17}$ atoms/cm$^3$ or less.

Incidentally, the value of $5 \times 10^{17}$ atoms/cm$^3$ is the lower limit of detection in the SIMS (Secondary Ion Mass Spectroscopy). As a result of analysis of TFTs experimentally produced by the present inventors, when the concentration is not higher than $1 \times 10^{18}$ atoms/cm$^3$ (preferably $5 \times 10^{17}$ atoms/cm$^3$ or less), the influence of nickel upon TFT characteristics can not be seen.

By the above heat treatment, a thermal oxidation reaction proceeds at the interface between the active layer 807 and the gate insulating film 808, so that the thickness of the gate insulating film 808 is increased by the thickness of a thermal oxidation film. When the thermal oxidation film is formed in this way, it is possible to obtain an interface of semiconductor/insulating film which has very small interfacial levels. Moreover, there is also an effect to prevent inferior formation (edge thinning) of a thermal oxidation film at the end of the active layer.

Further, it is also effective that after the heat treatment in the above-mentioned halogen atmosphere is carried out, a heat treatment in a nitrogen atmosphere approximately at 950° C. for one hour is carried out to improve the film quality of the gate insulating film 808.

Incidentally, it is also confirmed by the SIMS analysis that the halogen element, which was used for the gettering process, having a concentration of $1 \times 10^{15}$ to $1 \times 10^{20}$ atoms/cm$^3$ remains in the active layer 807. Moreover, it is confirmed by the SIMS analysis that at that time, the foregoing halogen element with a high concentration distributes between the active layer 807 and the thermal oxidation film formed by the heat treatment.

As a result of the SIMS analysis for other elements, it was confirmed that the concentration of C (carbon), N (nitrogen), and S (sulfur) was less than $5 \times 10^{18}$ atoms/cm$^3$, and the concentration of O (oxygen) was less than $1.5 \times 10^{19}$ atoms/cm$^3$.

Figure 8D:
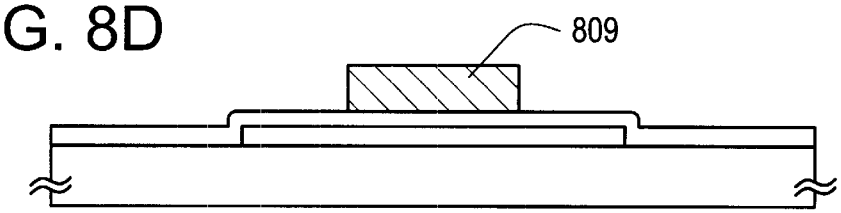

Next, a not-shown metal film mainly composed of aluminum is formed, and an original 809 for a subsequent gate electrode is formed by patterning. In this embodiment, the aluminum film containing scandium of 2 wt % is used. Incidentally, a tantalum film, a silicon film having conductivity, or the like may be used other than the aluminum film (FIG. 8D)

Here, the technique disclosed in Japanese Patent Unexamined Publication No. Hei. 7-135318 by the present inventors is used. The publication discloses the technique in which by using an oxide film formed by anodic oxidation, source/drain regions and a low concentration impurity region are formed in a self-aligning manner.

First, an anodic oxidation treatment is carried out in a solution of 3% oxalic acid while a resist mask (not shown) used in the patterning of the aluminum film remains, so that a porous anodic oxidation film 810 is formed.

The thickness of this porous anodic oxidation film 810 increases in proportion to a time. Since the resist mask remains on the upper surface, the porous film is formed only on the side surface of the original 809 of the gate electrode. In the technique disclosed in the Japanese Patent Unexamined Publication No. Hei. 7-135318, the film thickness subsequently becomes a length of a low concentration impurity region (also called an LDD region). In this embodiment, the anodic oxidation process is carried out under the condition that the film thickness becomes 700 nm.

Next, after the not-shown resist mask is removed, an anodic oxidation treatment is carried out in an electrolytic solution of an ethylene glycol solution mixed with tartaric acid of 3%. In this treatment, a dense nonporous anodic oxidation film 811 is formed. Since the electrolytic solution infiltrates also into the inside of the porous anodic oxidation film, the dense film is also formed inside thereof.

The film thickness of the nonporous anodic oxidation film 811 is determined according to an applied voltage. In this embodiment, the anodic oxidation treatment is carried out such that an applied voltage is made 80V to make a film thickness about 100 nm.

The aluminum film 812 still lying after the above-described two anodic oxidation treatments functions substantially as a gate electrode.

Figure 8E:
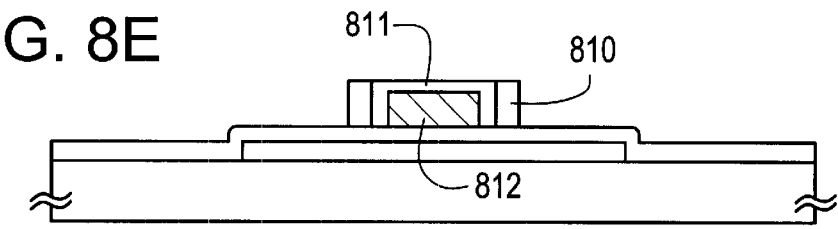
Figure 9A:
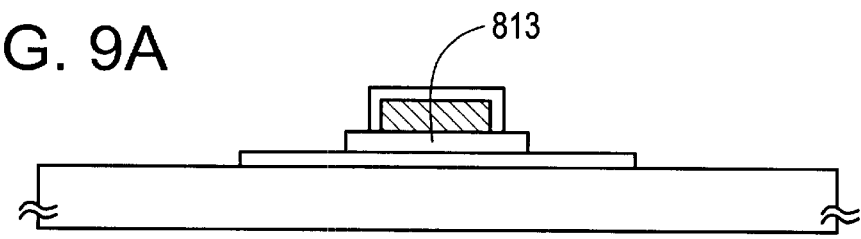
FIGS. 9A to 9D are views showing manufacturing steps of the thin film transistor.

After the state shown in FIG. 8E is obtained in this way, the gate insulating film 808 is next etched by a dry etching method using the gate electrode 812 and the porous anodic oxidation film 810 as masks. Then the porous anodic oxidation film 810 is removed. The end of the thus formed gate insulating film 813 is exposed by the thickness of the porous anodic oxidation film 810 (FIG. 9A).

Next, an adding step of an impurity element giving one conductivity is carried out. As the impurity element, P (phosphorus) or As (arsenic) may be used for an N type and B (boron) may be used for a P type.

Figure 9B:
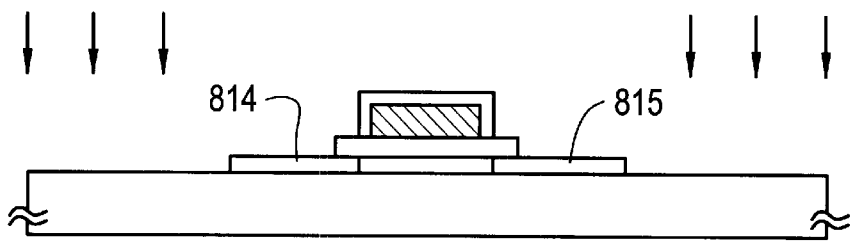

In this embodiment, the first impurity addition is carried out at a high acceleration voltage to form n$^-$ regions 814 and 815. At this time, since the acceleration voltage is as high as about 80 KeV, the impurity element is added into not only the surface of the active layer but also the portion under the end of the exposed gate insulating film. Adjustment is made so that the impurity concentration of the n$^-$ regions 814 and 815 becomes $1 \times 10^{18}$ to $1 \times 10^{19}$ atoms/cm$^3$ (FIG. 9B)

Figure 9C:
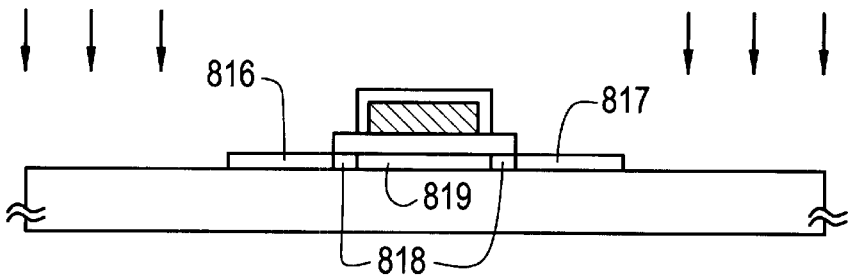

Further, the second impurity addition is carried out at a low acceleration voltage to form n$^+$ regions 816 and 817. Since the acceleration voltage is as low as about 10 KeV at this time, the gate insulating film functions as a mask. Adjustment is made so that the sheet resistance of the n$^+$ regions 816 and 817 becomes 500 Ω or less (preferably 300 Ω or less) (FIG. 9C).

In the impurity regions formed in the above steps, the N$^+$ regions become a source region 816 and a drain region 817, and the n$^-$ regions become low concentration impurity regions 818. An impurity element is not added into a region just below the gate electrode, so that the region becomes a substantially intrinsic channel formation region 819.

The low concentration impurity region 818 has an effect to relax a high electric field applied between the channel formation region 819 and the drain region 817, and is also called an LDD (Lightly Doped Drain) region.

After the active layer is completed in the manner as described above, activation of the impurity element is made by a combination of furnace annealing, laser annealing, lamp annealing, and the like. At the same time, damages of the active layer caused in the addition step are also repaired.

Next, an interlayer insulating film 820 with a thickness of 500 nm is formed. A silicon oxide film, a silicon nitride film, a silicon nitride oxide film, an organic resin film, or a lamination film thereof may be used as the interlayer insulating film 820.

Polyimide, acryl, polyamide, polyimide amide, or the like may be used as the organic resin film. The merits of the organic resin film are listed as follow: (1) a film forming method is simple, (2) a film thickness is easily made thick, (3) parasitic capacitance can be reduced since relative dielectric constant is low, and (4) flatness is excellent.

Next, after contact holes are formed, a source electrode 821 and a drain electrode 822 are formed. Finally, the entire of the substrate is heated in a hydrogen atmosphere at 350° C. for 1 to 2 hours to hydrogenate the entire of the device so that dangling bonds (unpaired bonds) in the film (especially in the active layer) are terminated.

Figure 9D:
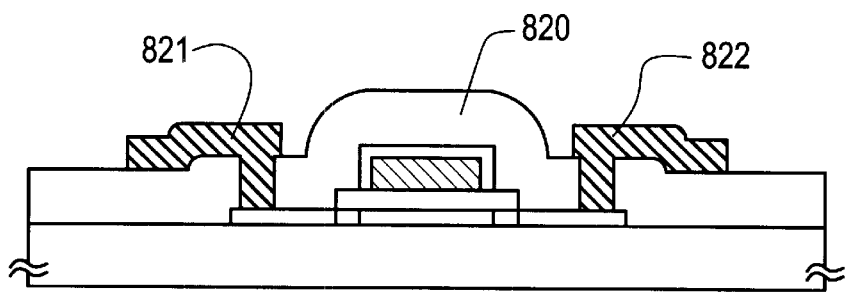

By the above steps, a TFT having a structure as shown in FIG. 9D can be manufactured. The features of the thus obtained TFT will be described below.

[Findings as to Crystal Structure of the Active Layer]

The active layer formed in accordance with the above manufacturing steps has a crystal structure in which a plurality of rod-like or flattened rod-like crystals are arranged almost in parallel to each other with regularity in a specific direction from a microscopic viewpoint. This can be easily confirmed by the observation using a TEM (Transmission Electron Microscopy).

FIG. 1 is an HR-TEM photograph showing crystal grain boundary of rod-like or flattened rod-like crystals magnified eight million times. In the present specification, the crystal grain boundary is defined as a grain boundary formed at a boundary at which the rod-like or flattened rod-like crystals are brought into contact with each other. Thus, the crystal grain boundary will be considered as a different thing from such a macroscopic grain boundary as is formed by collision of the lateral growth regions with each other.

The foregoing HR-TEM (High Resolution Transmission Electron Microscopy) is a method in which an electron beam is vertically irradiated to a sample, and the interference of transmitted electrons or elastic scattering electrons is used to recognize the arrangement of atoms and/or molecules.

In the HR-TEM, it is possible to observe the arrangement state of crystal lattices as lattice stripes. Thus, when the crystal grain boundary is observed, it is possible to presume the bonding state among atoms at the crystal grain boundary. Although the lattice stripes appear as a black and white lattice pattern, the pattern is caused from a difference in contrast and does not indicate positions of atoms.

FIG. 1A is a typical TEM photograph showing a crystalline silicon film obtained in the present invention, and indicates the state in which two different crystal grains are brought into contact with each other at a crystal grain boundary seen from the upper left to the lower right in the photograph. At this time, although crystal axes of the two crystal grains are slightly shifted from each other, the crystal grains have substantially {110} orientation.

As is described later, as a result of examination of a plurality of crystal grains, it is confirmed by the electron beam diffraction that almost all crystal grains have substantially the {110} orientation.

Although some of many observed crystal grains should have a (011) plane or (101) plane, those equivalent planes will be together expressed by a {110} plane. The reason will be described in brief with reference to FIGS. 2A to 2C.

Figure 2A:
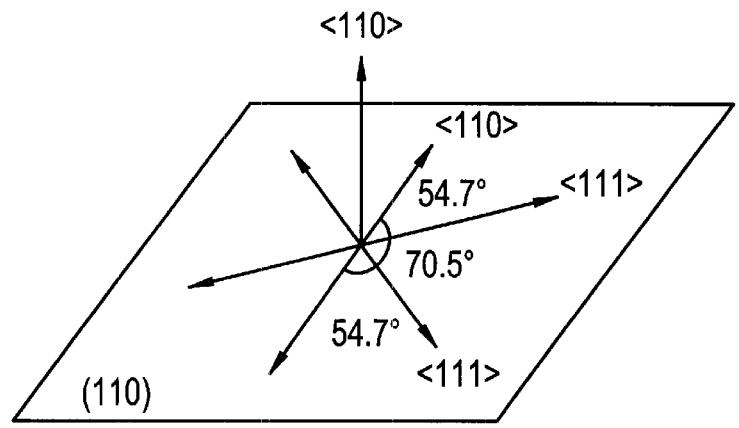
FIGS. 2A to 2C are views schematically showing the relation of crystal orientation.

FIG. 2A shows an example in which a crystal grain having the crystal plane of {110} (crystal axis is <110>) is schematically shown. A <111> axis and <100> axis or the like is included in the crystal plane of {110}.

Figure 2B:
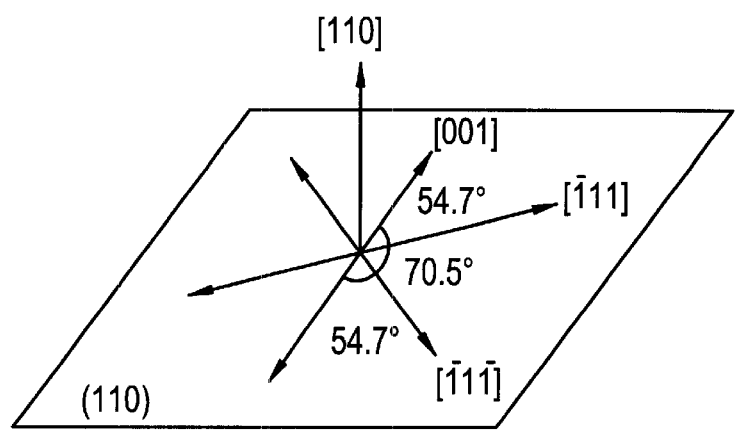
Figure 2C:
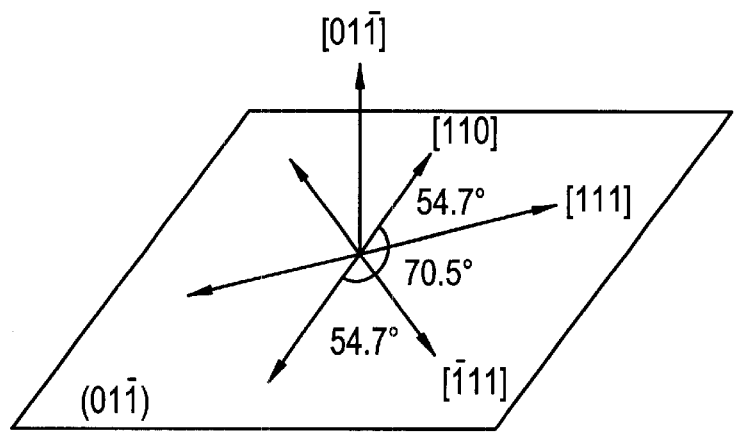

A notation system as shown in FIG. 2A is an example of a collective exponential notation. If this is expressed by a strict exponential notation, this is as shown in FIGS. 2B and 2C. For example, a crystal axis [110] and a crystal axis [01-1] are equivalent to each other, and are unified into <110>.

Incidentally, although the notation of [01-1] is used for the convenience of writing format, (-) of -1 is used as a substitute for a logical symbol indicating inversion.

As described above, since various views are possible if arguments are made using strict crystal orientation (crystal axis), for simplification, all the following descriptions will be based on the collective exponential notation. Of course, similar physical properties are obtained in all the equivalent crystal planes.

As shown in FIG. 1A, lattice stripes corresponding to the {111} plane and the {100} plane are observed. Here, the lattice stripe corresponding to the {111} plane indicates such a lattice stripe that when the crystal grain is cut along the lattice stripe, the {111} plane appears at the section. It can be simply confirmed from the distance between lattice stripes to what plane the lattice stripe corresponds.

Although a plurality of lengthwise, crosswise, and oblique lattice stripes can be seen in the upper crystal grain in FIG. 1A, only one lattice stripe can be seen in the lower crystal grain. It is conceivable that this is caused by the influence of an irradiation direction of an electron beam at the observation of the TEM. That is, in the upper crystal grain, since the electron beam impinges vertically on the crystal face, a plurality of lattice stripes in the face can be seen. On the other hand, since the lower crystal grain is slightly tilted with respect to the upper crystal as a reference, the electron beam does not impinge vertically thereon, and thereby, only a specific lattice stripe is seen.

We will pay attention to the lattice stripe corresponding to the {111} plane. As is apparent from FIG. 1A, the lattice stripe (although two stripes are seen in the drawing, one of them) corresponding to the {111} plane of the upper crystal grain is parallel to the lattice stripe corresponding to the {111} plane of the lower crystal grain.

Irrespective of the existence of the crystal grain boundary, the lattice stripes of two different grains are connected to each other so as to cross the crystal grain boundary. That is, it can be confirmed that almost all lattice stripes observed to cross the crystal grain boundary are linearly continuous with each other although they are lattice stripes of different crystal grains. This is the same in any crystal grain boundary.

Such a crystal structure is the remarkable feature of the crystalline silicon film of the present invention, and that is the crystal structure capable of realizing the crystal grain boundary which the present inventors sought.

Such a crystal structure (correctly the structure of crystal grain boundary) indicates that two different crystal grains are brought into contact to each other with extremely excellent order at the crystal grain boundary. That is, at the crystal grain boundary, the crystal lattices are continuous with each other to form a structure in which trap levels caused from crystal defects or the like are hardly made. In other words, it may be said that the crystal lattice has continuity at the crystal grain boundary.

Figure 1B:
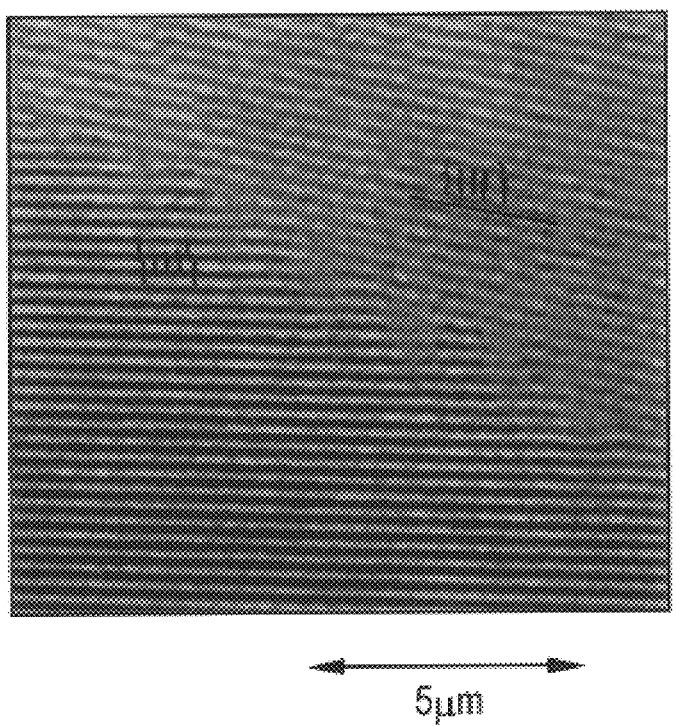

For reference, an HR-TEM photograph of a conventional high temperature polysilicon film is shown in FIG. 1B. In the case of FIG. 1B, although described later, there was no regularity in the crystal face, and the film did not have orientation in which the {110} plane becomes main. However, in order to make comparison with FIG. 1A, a crystal grain in which a lattice stripe corresponding to the {111} plane appeared, was observed.

In the lattice stripes of FIG. 1B, only one lattice stripe is seen in both the upper crystal grain and the lower crystal grain. The reason is as described before. As a result of measurement of a distance between lattice stripes by a method similar to that mentioned before, as shown in FIG. 1B, it was confirmed that the lattice stripes seen in the upper and lower crystal grains correspond to the {111} plane.

However, as shown in FIG. 1B, the mutual lattice stripes were not parallel with each other, and it was found that the crystal structure was apparently different from that as shown in FIG. 1A.

Moreover, as shown by an arrow in the drawing, many portions where the lattice stripes are not continuous can be confirmed at the crystal grain boundary. Uncoupled bonds (called crystal defects) exist in such portions, and there is a high possibility that as trap levels, they hinder the movement of carriers.

As described above, in the crystalline silicon film of the present invention, the lattices have continuity even at the crystal grain boundary, and such crystal defects can be hardly confirmed. Also from this point, it is verified that the crystalline silicon film of the present invention is a semiconductor film quite different from a conventional high temperature polysilicon film.

FIGS. 3A to 3C show results of measurement of the crystalline silicon film of the present invention by electron beam diffraction. FIG. 3A shows a typical electron beam diffraction pattern of the crystalline silicon film of the present invention, and FIG. 3B shows a typical electron beam diffraction pattern of a conventional high temperature polysilicon film for reference.

In FIGS. 3A and 3B, since measurement is made while a diameter of a radiation spot of an electron beam is made 1.35 $\mu$m, it may be considered that the information of a sufficiently macro region as compared with a lattice stripe level can be collected.

FIG. 3C shows an electron beam diffraction pattern in the case where an electron beam is vertically irradiated to the {110} plane of single crystal silicon. In general, by comparing such an electron beam diffraction pattern with an observed result, inference is made as to what is the orientation of an observed sample.

In the case of FIG. 3A, since a diffraction spot as shown in FIG. 3C, which corresponds to the incidence of <110>, appears clearly, it can be confirmed that the crystal axis is the <110> axis (crystal face is the {110} plane).

Although the respective spots have small concentric expanses, it is presumed that this is caused from a distribution of rotation angles of some degree around the crystal axis. The degree of the expanse is within 5° from the evaluation of the pattern.

Among many observations, there was a case where the diffraction spot was partially not seen (a part of the diffraction spots is not seen also in FIG. 3A). It appears that although the crystal has substantially the {110} orientation, since crystal axes are slightly shifted, the diffraction pattern becomes unseen.

Based on the fact that the {111} plane is almost always included in a crystal face, the present inventors presume that the shift of rotation angle around the <111> axis causes such a phenomenon.

On the other hand, in the case of an electron beam diffraction pattern shown in FIG. 3B, diffraction spots do not show definite regularity, and it is confirmed that they are almost random oriented. That is, it is presumed that crystals having plane orientations other than the {110} plane are irregularly mixed.

As shown from these results, the feature of the crystalline silicon film of the present invention is that almost all crystal grains are oriented substantially in the {110} plane, and the lattice has continuity at the crystal grain boundary. These features are not seen in a conventional polysilicon film.

The reason why almost all crystal grains are oriented substantially in the {110} plane is presumed as follows from the contents disclosed in Japanese Patent Unexamined Publication No. Hei. 7-321339 by the present inventors et al.

It is confirmed by TEM photographs that when an amorphous silicon film is crystallized, the growth direction of rod-like or flattened rod-like crystal (also referred to as needle-like or column-like crystal) grown in substantially parallel to a substrate is the <111> axis. This state is schematically shown in FIG. 20.

In the case where an amorphous silicon film is crystallized by using Ni as a catalytic element, crystal growth is made along the direction of the <111> axis via $NiSi_2$ educts. It is conceivable that this is caused since the consistency between the {111} planes is structurally good at the crystal faces of NiSihd 2and Si.

Figure 20:
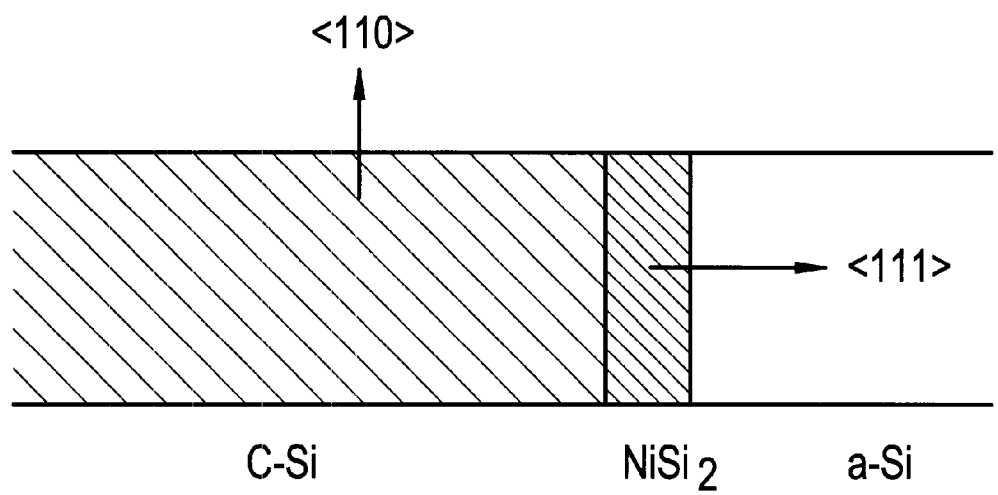
FIG. 20 is a view schematically showing the state of crystal growth.

Since the inside of the grown rod-like or flattened rod-like crystal can be seen substantially as single crystal, FIG. 20 shows c-Si (crystal silicon).

At this time, although various planes are formed on the side (face parallel to the direction of growth) of the rod-like or flattened rod-like crystal grown in the direction of the <111> axis, the most easily appearing plane is the {110} plane. The reason is assumed that the {110} plane has the highest atomic density among some planes to be formed on the side.

From these reasons, in the crystal grains grown with the head of {111} plane (crystal grain grown along the <111> axis direction) as in the present invention, the {110} plane appears on the surface (which means the observed surface).

The present inventors performed X-ray diffraction in accordance with a method disclosed in Japanese Patent Unexamined Publication No. Hei. 7-321339, and calculated the ratio of orientation with respect to the crystalline silicon film of the present invention. In the publication, the ratio of orientation is defined by the calculation method as indicated by the following expression 1:

{220} orientation existing ratio=1 (constant),

{111} orientation existing ratio=(relative strength of {111} to {220} of a sample)/(relative strength of {111} to {220} of powder), {311} orientation existing ratio=(relative strength of {311} to {220} of a sample)/(relative strength of {311} to {220} of powder), {220} orientation ratio=({220} orientation existing ratio)/({220} orientation existing ratio+{111} orientation existing ratio+ {311} orientation existing ratio).

In the measurement, although observation is made as the {220} plane, it is needless to say that this is equivalent to the {110} plane. As a result of the above measurement, it has been found that the {110} plane is the main orientation, and the orientation ratio is 0.7 or more (typically 0.9 or more).

As have been described above, it is understood that the crystalline silicon film of the present invention has a crystal structure (crystal constitution) quite different from a conventional polysilicon film. Also from this point, it may be said that the crystalline silicon film of the present invention is a quite novel semiconductor film.

[Findings as to Electrical Characteristics of TFT]

Figure 4:
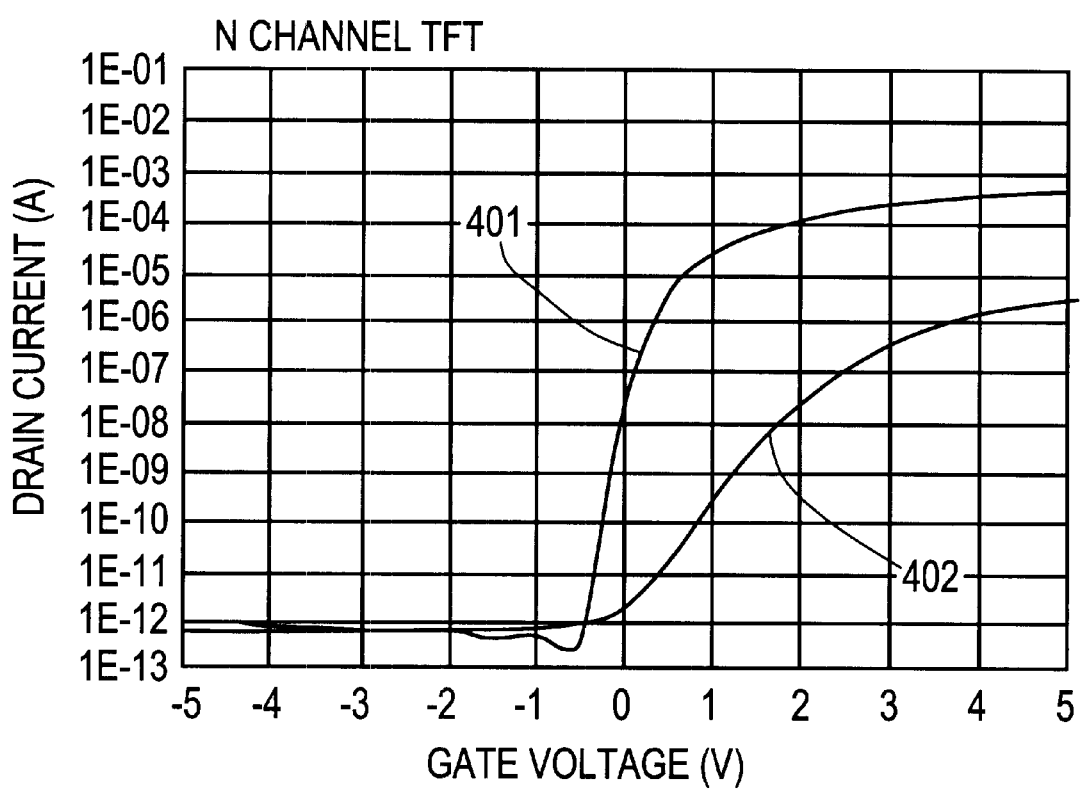
FIG. 4 is a view showing electric characteristics of a thin film transistor.

A TFT manufactured by using an active layer of the above described crystalline silicon film shows electrical characteristics as shown in FIG. 4. FIG. 4 shows Id-Vg curves (Id-Vg characteristics) of an N channel TFT in which plots are made by taking gate voltage (Vg) in the horizontal axis and logarithm of drain current (Id) in the vertical axis. The measurement of the electrical characteristics was made by using a commercially available apparatus (Model No. 4145B made by Hewlett-Packard Co.).

In FIG. 4, reference numeral 401 denotes electrical characteristics of a TFT using the active layer obtained in the above steps, and 402 denotes electrical characteristics of a conventional TFT. Here, as the conventional TFT, a TFT in which the heat treatment (gettering process) after the formation of a gate insulating film was not carried out in the embodiment 1 is used.

When the characteristics of both transistors are compared with each other, it is first confirmed that even at the same gate voltage, on-current in the characteristics 401 is larger approximately by 2–4 figures. The on-current indicates a drain current flowing when a TFT is in an on-state (the gate voltage in FIG. 4 is in the range of about 0 to 5 V).

It is also confirmed that the characteristics 401 include a more excellent subthreshold characteristic. The subthreshold characteristic is a parameter showing the steepness of a switching operation of a TFT. As the rising of the Id-Vg curve at the time when a TFT is switched on or off is steep, the subthreshold characteristic is excellent.

Typical electrical characteristics of the TFT obtained in the present invention are as follows. (1) The subthreshold coefficient as a parameter showing switching performance (promptness in switching of on/off operation) of a TFT is as small as 60 to 100 mV/decade (typically 60 to 85 mV/decade) for both an N-type TFT and a P-type TFT. The value of this data is almost equal to the case of an insulated gate field effect transistor (IGFET) using single crystal silicon. (2) The field effect mobility ($\mu_{FE}$) as a parameter showing an operation speed of a TFT is as large as 200 to 650 $cm^2/Vs$ (typically 250 to 300 $cm^2/Vs$) for an N-type TFT, and 100 to 300 $cm^2/Vs$ (typically 150 to 200 $cm^2/Vs$)

for a P-type TFT. (3) The threshold voltage ($V_{th}$) as a parameter indicating a driving voltage of a TFT is as small as −0.5 to 1.5 V for an N-type TFT and −1.5 to 0.5 V for a P-type TFT. This means that the TFT can be driven by a small power voltage so that the consumed power can be made small.

As described above, the TFT obtained in the present invention has extremely superior switching characteristics and high speed operation characteristics.

(Characteristics of circuit constituted by TFTs of the present invention)

Next, frequency characteristics of a ring oscillator manufactured by the present inventors by using TFTs of the present invention will be described. The ring oscillator is a circuit in which odd stages of inverter circuits formed of a CMOS structure are connected like a ring, and is used to obtain a delay time for one stage of the inverter circuit. The structure of the ring oscillator used in the experiments is as follows:

number of stages: 9 stages,
film thickness of a gate insulating film of the TFT: 30 nm and 50 nm, and
gate length of the TFT: 0.6 μm.

Figure 5:
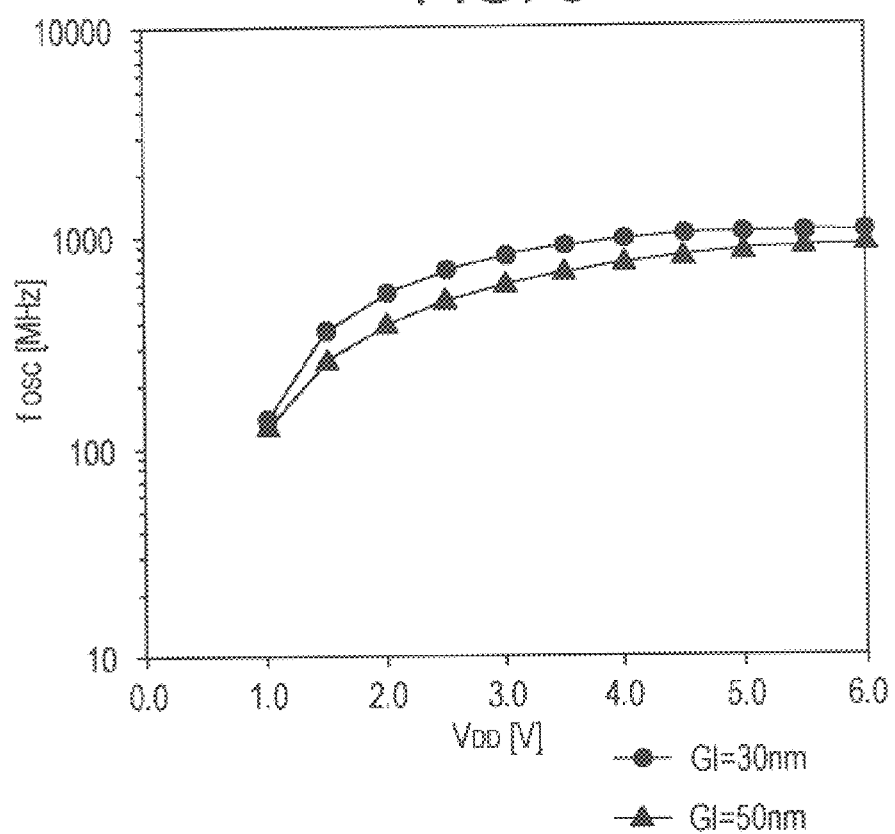
FIG. 5 is a view showing frequency characteristics of a ring oscillator.

FIG. 5 shows the result of measurement by a spectrum analyzer for an oscillation frequency at the power voltage of 5 V of the above-mentioned ring oscillator. In FIG. 5, the horizontal axis indicates a power source voltage ($V_{DD}$) and the vertical axis indicates an oscillation frequencies ($f_{OSC}$). As shown in FIG. 5, in the case where a TFT having a gate insulating film 30 nm thick is used, the oscillation frequency of 1 GHz or more is realized.

Figure 6:
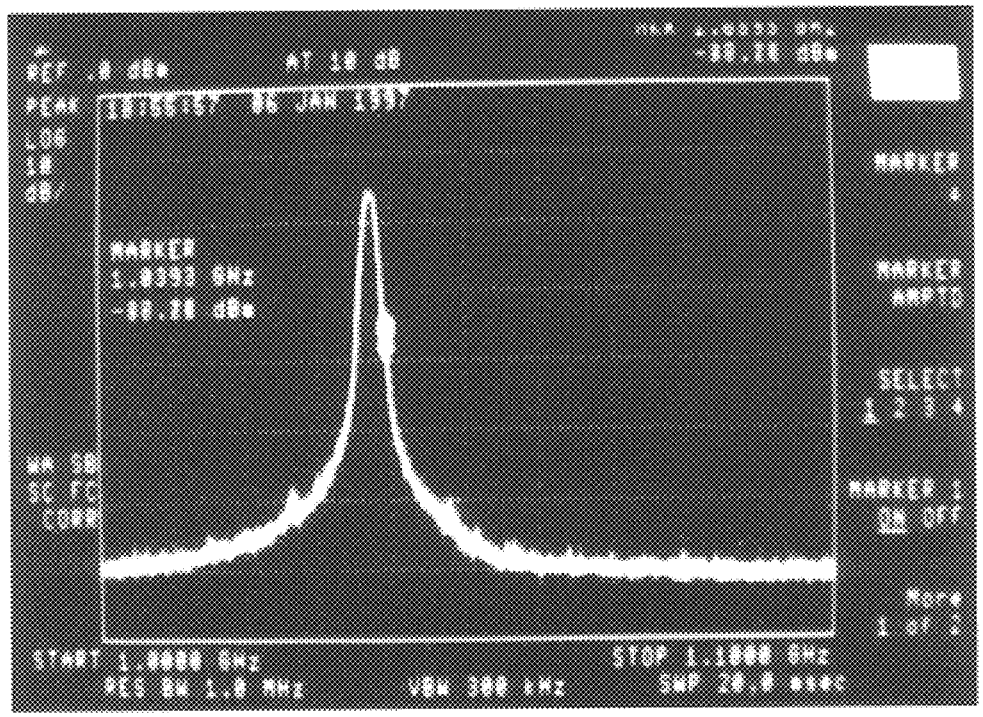
FIG. 6 is a photograph showing an output spectrum of a ring oscillator.

FIG. 6 shows the state of an output spectrum by a spectrum analyzer when an oscillation frequency of 1.04 GHz is obtained. The horizontal axis indicates a frequency from 1 GHz to 1.1 GHz, and the vertical axis indicates a voltage (output amplitude) in the logarithm scale. As is apparent from FIG. 6, the peak of output spectrum appears at about 1.04 GHz. The tale of the output spectrum is caused from the resolution of the apparatus, and it does not have an influence on the experimental results.

A shift register as one of TEGs of LSI circuits was really manufactured and the operation frequency was confirmed. As a result, in the shift register in which the thickness of a gate insulating film was 30 nm, the gate length was 0.6 μm, the power source voltage was 5 V, and the number of stages was 50, the output pulse of operation frequency 100 MHz was obtained.

The surprising data of the ring oscillator and shift register as described above show that the TFT of the present invention has performance comparable to or superior to an IGFET using single crystal silicon.

As the proof for supporting that, the following data exist. The data shown in FIG. 7 are expressed by a graph in which the horizontal axis indicates a power source voltage ($V_{DD}$) and the vertical axis indicates a delay time ($\tau_{pd}$) for one stage of an inverter of F/O=1 (fan-out ratio is 1) (Innovation of Logic LSI Technique, Kenji Maeguchi et al, p 108, Kabusiki Kaisha Science Forum, 1995).

The various curves (indicated by dotted lines) in the drawing express data when IGFETs using single crystal silicon are manufactured in various design rules, and indicates the so-called scaling law.

Figure 7:
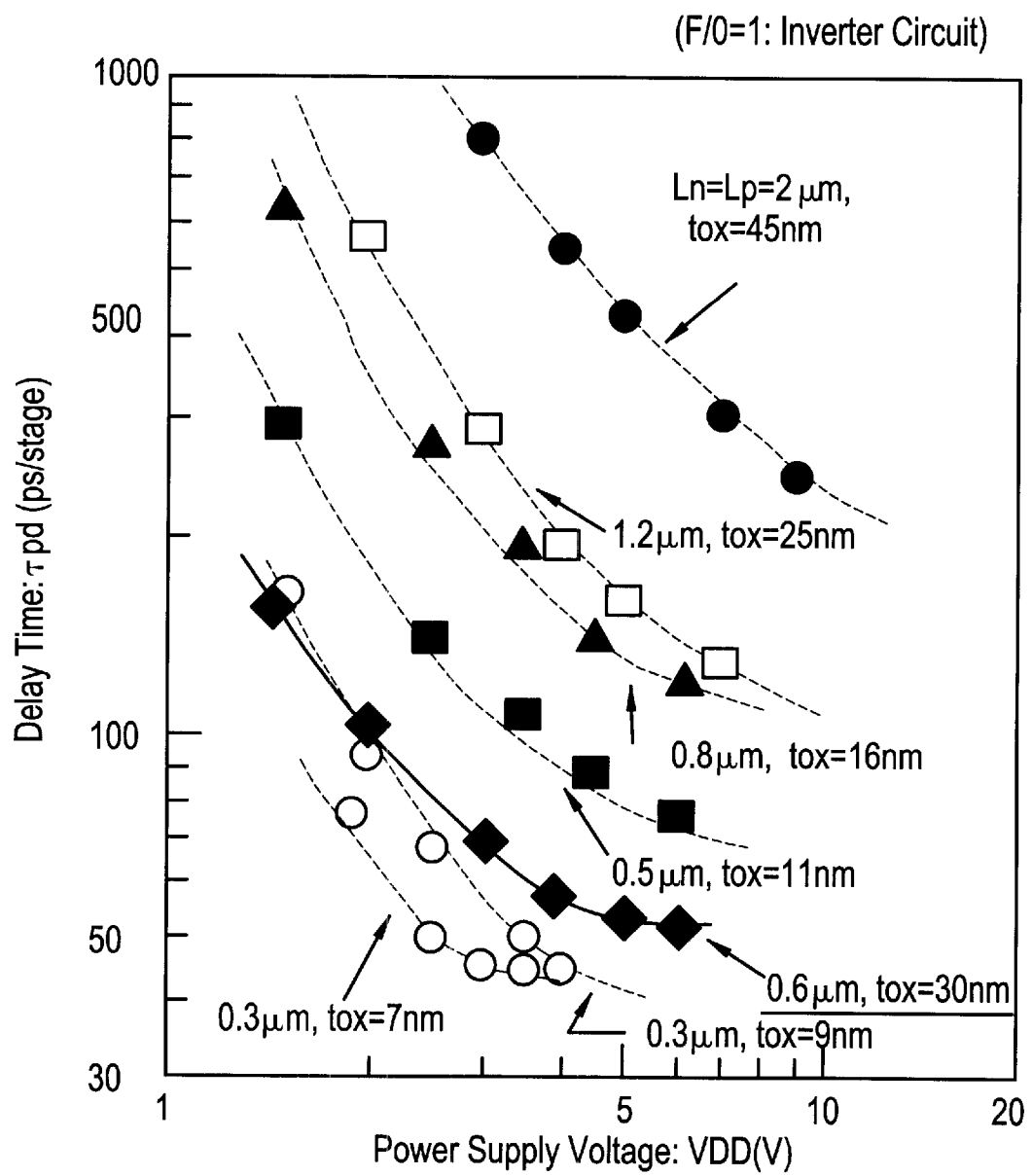
FIG. 7 is a view showing the scaling law.

When the relation between the delay time of the inverter and the power source voltage obtained by using the above-described ring oscillator is applied to this drawing, the curve shown by a solid line in FIG. 7 is obtained. It should be noted that the inverter formed of a TFT with a channel length of 0.6 μm and a gate insulating film thickness ($t_{OX}$) of 30 nm has superior performance to the inverter formed of an IGFET with a channel length of 0.5 m and a gate insulating film thickness ($t_{OX}$) of 11 nm.

This clearly shows that the TFT of the present invention has performance superior to the IGFET. For example, even if the film thickness of the gate insulating film that constitutes the above-described TFT is made large three times that of the IGFET, a device having performance comparable to or superior to the IGFET can be obtained. That is, it may be said that the TFT of the present invention has a withstand voltage superior to the IGFET having characteristics and operation performance comparable to the TFT of the present invention.

At the same time, if the TFT of the present invention is miniaturized in accordance with the scaling law, it is possible to realize further high performance. For example, if the ring oscillator is manufactured in a 0.2 μm rule, according to the scaling law, it is expected that an operation frequency of 9 GHz can be realized (since the operation frequency f is in reverse proportion to the square of the channel length L).

As described above, the TFT of the present invention has extremely excellent characteristics, and it is confirmed that the semiconductor circuit formed by using the TFT is a quite novel TFT which can realize a high speed operation of 10 GHz or more.

Embodiment 2

Although a silicon film is used as a semiconductor film in the embodiment 1, it is also effective to use a silicon film containing germanium of 1 to 10% as expressed by $Si_xGe_{1-x}$ (0<X<1, preferably 0.9<X<0.99).

In the case where such a compound semiconductor film is used, a threshold voltage can be made small when an N-type TFT and a P-type TFT are manufactured. In addition, the field effect mobility (referred to as mobility) can be made large.

Embodiment 3

Since an impurity is not intentionally added in an active layer in the embodiment 1, the channel formation region becomes intrinsic or substantially intrinsic. Incidentally, the term "substantially intrinsic" means that one of the following conditions is satisfied: (1) the activation energy of a silicon film is about ½ (Fermi level is positioned at almost the center of a forbidden band, (2) an impurity concentration is lower than the spin density, and (3) an impurity is not intentionally added.

However, it is also possible to use a well-known channel doping technique for the TFT of the present invention. The channel doping technique is a technique in which an impurity is added into at least a channel formation region to control a threshold value.

Since the threshold value in the present invention is originally very small, it is sufficient that the concentration of an added impurity is extremely low. When it is sufficient that the addition concentration is very low, a threshold value can be controlled without decreasing the mobility of carriers. Thus, that is extremely preferable.

Embodiment 4

In this embodiment, in addition to the gettering effect by the halogen element shown in the embodiment 1, the structure for obtaining the gettering effect by a phosphorus element will be described. FIG. 10 is used for the description.

First, in accordance with the embodiment 1, the steps till the gettering process by the halogen element are carried out to obtain the state shown in FIG. 8C. Next, a gate electrode 11 composed of tantalum or mainly composed of tantalum is formed.

Figure 10A:
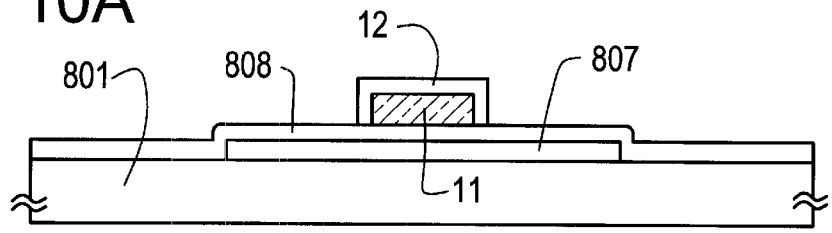
FIGS. 10A to 10E are views showing manufacturing steps of a thin film transistor.

Next, the surface of the gate electrode 11 is subjected to anodic oxidation to form an anodic oxidation film 12. The anodic oxidation film 12 functions as a protective film (FIG. 10A).

Figure 10B:
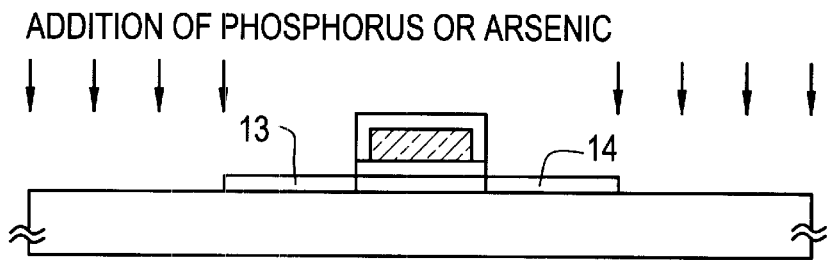

Next, the gate insulating film 808 is etched by a dry etching method by using the gate electrode 11 as a mask. In this state, phosphorus or arsenic is added by an ion implantation method to form impurity regions 13 and 14 (FIG. 10B).

Next, after the silicon nitride film is thickly formed, etch-back by a dry etching method is carried out to form a side wall 15. After the side wall 15 is formed, phosphorus or arsenic ions are again added to form a source region 16 and a drain region 17 (FIG. 10C).

Portions under the side wall 15 are not added with the second phosphorus element and become a pair of low concentration impurity regions 18 containing the phosphorus element with a concentration lower than the source region and the drain region. The portion under the gate electrode 11 becomes a channel formation region 19 which is intrinsic, or substantially intrinsic, or in which a trace amount of impurity is added for controlling a threshold value.

Figure 10C:
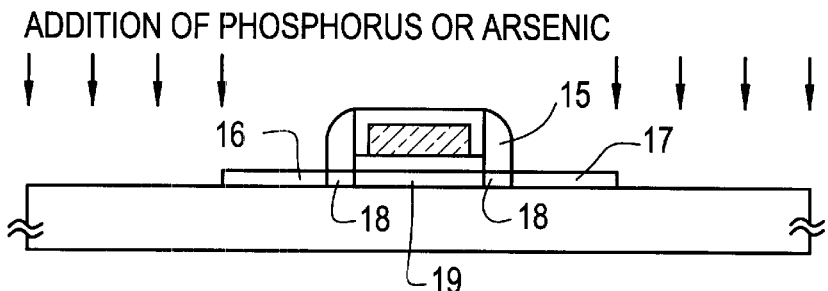

In this way, after the state shown in FIG. 10C is obtained, a heat treatment at a temperature of 450 to 650° C. (typically 600° C.) for 8 to 24 hours (typically 12 hours) is carried out.

This heat treatment is a step for gettering the catalytic element (here, nickel) by the phosphorus element, and at the same time, the impurity is activated and the damages caused in the active layer at the ion implantation are recovered.

In this step, by carrying out the heat treatment, nickel remaining in the channel formation region 19 moves to the source/drain regions 16 and 17, and is gettered at the place to be inactivated. That is, it is possible to remove nickel remaining in the channel formation region 19.

Since the source/drain regions 16 and 17 function as electrodes if they are conductive, there is no fear that the existence of nickel has an influence on the electrical characteristics. Thus, they can be served as a gettering site.

Figure 10D:
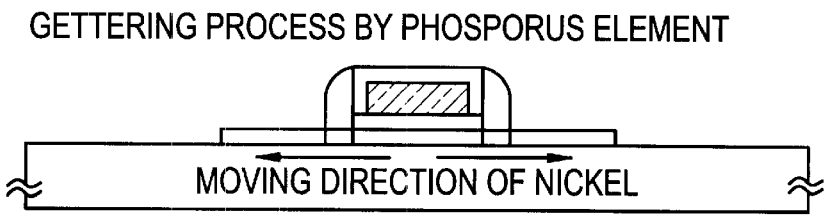
Figure 10E:
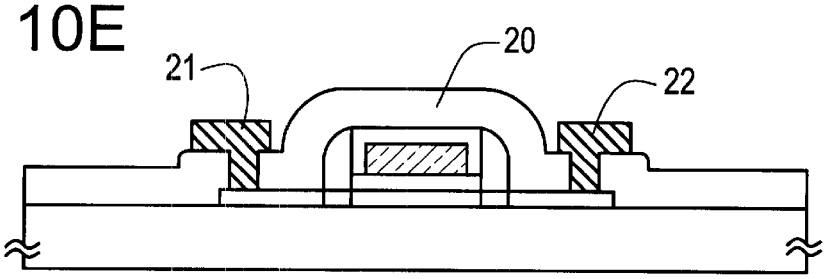

After the state as shown in FIG. 10D is thus obtained, an interlayer insulating film 20, a source electrode 21, and a drain electrode 22 are formed in the same manner as the embodiment 1, so that a thin film transistor shown in FIG. 10E is completed.

In this embodiment, although tantalum is used for the gate electrode, a crystalline silicon film having conductivity may be used. Moreover, the method of forming a low concentration impurity region is not limited to the means of this embodiment.

The most important structure of this embodiment is to getter the catalytic element remaining in the channel formation region by removing the element to the source region and the drain region. In the invention, attention is paid to the gettering effect of the metal element by phosphorus or arsenic.

Although an N-type TFT is shown in this embodiment, in the case of a P-type TFT, since the gettering effect can not be obtained by only a boron element, it is necessary to add both the phosphorus element and boron element into the source/drain regions.

Embodiment 5

In this embodiment, an example in which the present invention is applied to a thin film transistor having a structure different from the embodiment 1 will be described. FIG. 11 is used for the description.

First, a gate electrode 32 is formed on a quartz substrate 31. It is necessary to use an electrode having high heat resistance such as tantalum, silicon and the like so that the gate electrode 32 can withstand a subsequent thermal oxidation step.

Next, a gate insulating film 33 is formed so as to cover the gate electrode 32. An amorphous silicon film with a thickness of 50 nm which becomes subsequently an active layer is formed thereon. In the same manner as in the embodiment 1, after a mask insulating film 35 having an opening is formed, a layer 36 containing nickel is formed (FIG. 11A).

Figure 11A:
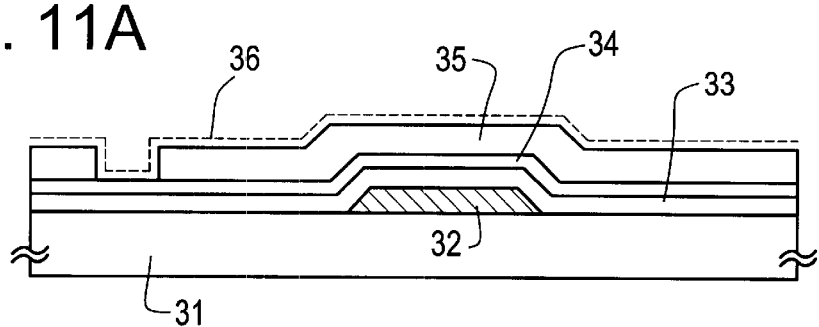
FIGS. 11A to 11E are views showing manufacturing steps of a thin film transistor.
Figure 11B:
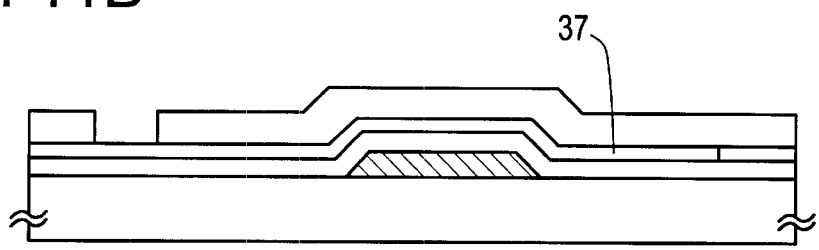

After the state shown in FIG. 11(A) is obtained, a heat treatment for crystallization is carried out to obtain a crystalline silicon film 37 made up of a lateral growth region (FIG 11B).

Figure 11C:
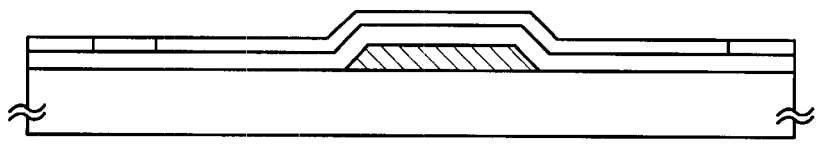

Next, the mask insulating film 35 is removed and a heat treatment is carried out in an atmosphere containing a halogen element. It is sufficient if the conditions are the same as the embodiment 1. By this step, nickel is gettered from the crystalline silicon film 37 to be removed into a vapor phase (FIG. 11C).

Figure 11D:
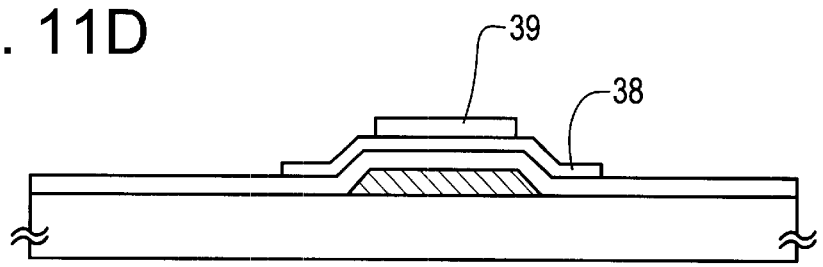

After the gettering process is completed in this way, an active layer 38 made up of only the lateral growth region is formed by patterning, and a channel stopper 39 made of a silicon nitride film is formed thereon (FIG. 11D).

After the state shown in FIG. 11D is obtained, a crystalline silicon film having an N-type is formed and is patterned to form a source region 40 and a drain region 41. Further, a source electrode 42 and a drain electrode 43 are formed.

Figure 11E:
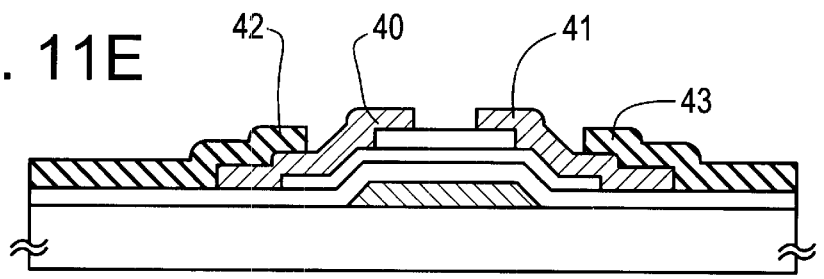

Finally, a heat treatment for the entire of the device is carried out in a hydrogen atmosphere, so that a reverse stagger type TFT as shown in FIG. 11E is completed. The structure shown in this embodiment is an example of the reverse stagger type TFT, and the invention is not limited to the structure of this embodiment. It is also possible to apply the invention to other bottom gate type TFT.

Embodiment 6

In this embodiment, an example in which TFTs of the present invention are formed on a substrate having an insulating surface so that a pixel matrix circuit and a peripheral circuit are formed in a monolithic manner, will be described with reference to FIGS. 12 to 14. In this embodiment, as an example of peripheral circuits such as a driver circuit and a logic circuit, a CMOS circuit as a basic circuit will be described.

Figure 12A:
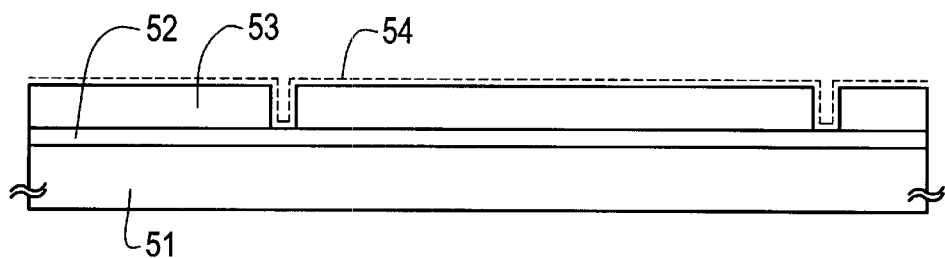
FIGS. 12A to 12D are views showing manufacturing steps of an active matrix substrate.

First, an amorphous silicon film 52 with a thickness of 75 nm and a mask insulating film 53 are formed on a quartz substrate 51, and a nickel containing layer 54 is formed by a spin coating method. These steps are similar to those shown in the embodiment 1 (FIG. 12A).

Figure 12B:
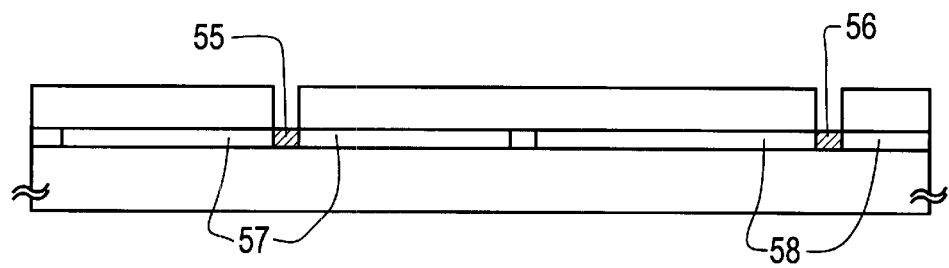

Next, after hydrogen is extracted under the conditions of approximately a temperature of 450° C. for one hour, a heat treatment in a nitrogen atmosphere at 590° C. for 8 hours is carried out to obtain crystalline regions 55 to 58. Reference numerals 55 and 56 denote nickel added regions, and 57 and 58 denote lateral growth regions (FIG. 12B).

Figure 12C:
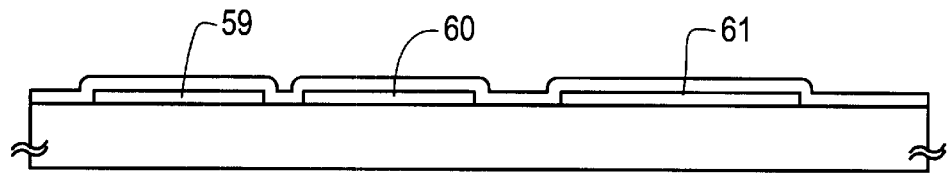

After the heat treatment for crystallization is ended, the mask insulating film 53 is removed and patterning is carried out to form island-like semiconductor layers (active layers) 59 to 61 made up of only the lateral growth regions 57 and 58 (FIG. 12C).

Here, reference numeral 59 denotes an active layer of an N-type TFT constituting a CMOS circuit, 60 denotes an active layer of a P-type TFT constituting the CMOS circuit, and 61 denotes an active layer of an N-type TFT (pixel TFT) constituting a pixel matrix circuit.

Figure 12D:
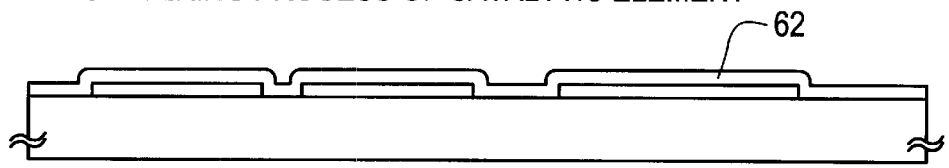

After the active layers 59 to 61 are formed, a gate insulting film 62 made of an insulating film containing silicon is formed thereon. Then the gettering process of the catalytic element is carried out. It is sufficient to set the condition of this step in accordance with the embodiment 1 (FIG. 12D).

Figure 13A:
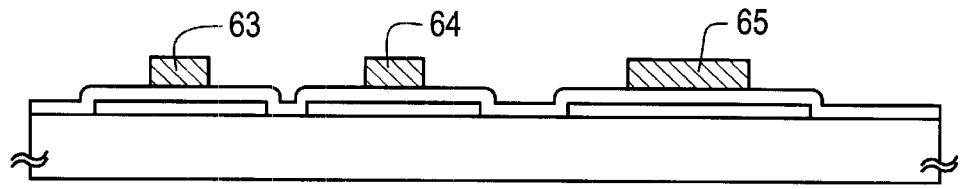
FIGS. 13A to 13D are views showing manufacturing steps of the active matrix substrate.

Next, a not-shown metal film mainly composed of aluminum is formed, and patterning is carried out to form originals 63 to 65 of subsequent gate electrodes. In this embodiment, an aluminum film containing scandium of 2 wt % is used (FIG. 13A).

Figure 13B:
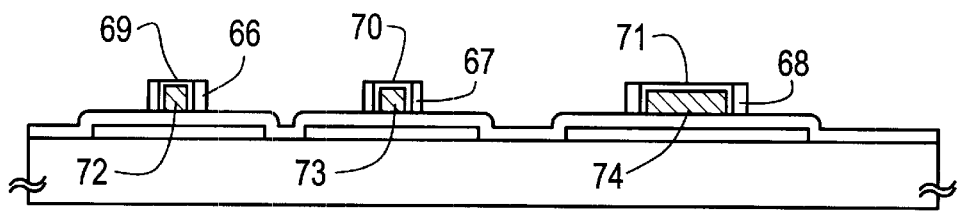

Next, in the same manner as the embodiment 1, by the technique disclosed in Japanese Patent Unexamined Publication No. Hei. 7-135318, porous anodic oxidation films 66 to 68, nonporous anodic oxidation films 69 to 71, and gate electrodes 72 to 74 are formed (FIG. 13B).

Figure 13C:
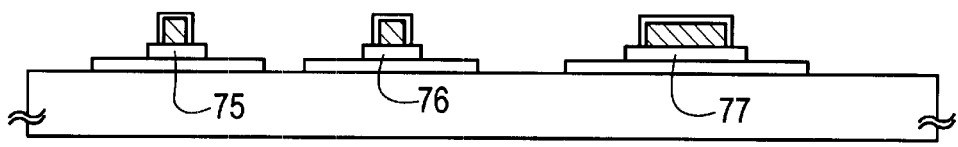

After the state shown in FIG. 13B is obtained in this way, the gate insulating film 62 is etched by using the gate electrodes 72 to 74 and the porous anodic oxidation films 66 to 68 as masks. Then the porous anodic oxidation films 66 to 68 are removed to obtain the state shown in FIG. 13C. In FIG. 13C, reference numerals 75 to 77 denote gate insulating films after processing.

Next, in accordance with the same procedure as the embodiment 1, the process of addition of impurity ions for giving N-type is divided into two steps and the addition is made. The first impurity addition is carried out at a high acceleration voltage to form an $n^-$ region, and then the second impurity addition is carried out at a low acceleration voltage to form an $n^+$ region.

Through the above steps, a source region 78, a drain region 79, a low concentration impurity region 80, and a channel formation region 81 of an N-type TFT constituting the CMOS circuit are formed. Also a source region 82, a drain region 83, a low concentration impurity region 84, and a channel formation region 85 of an N-type TFT constituting the pixel TFT are defined (FIG. 13D).

Figure 13D:
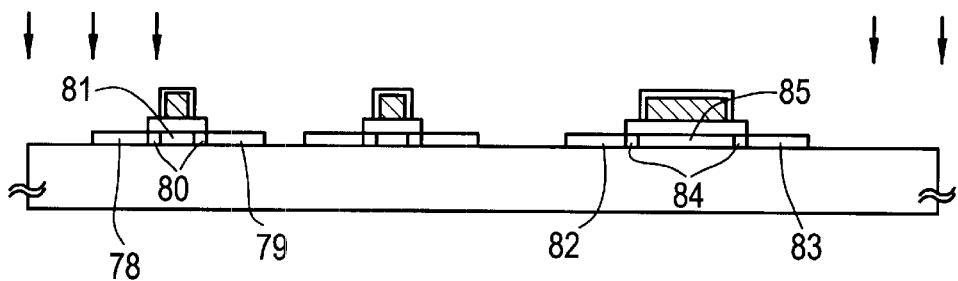

In the state shown in FIG. 13D, the active layer of the P-type TFT constituting the CMOS circuit has the same structure as the active layer of the N-type TFT.

Next, a resist mask 86 is provided to cover the N-type TFT, and the addition of an impurity ion (boron is used in this embodiment) for giving P-type is carried out.

Although this process is also divided into two steps in the same manner as the foregoing impurity addition process, since it is necessary to convert the N-type to P-type, B (boron) ions having a concentration several times as large as the addition concentration of the foregoing P ions are added.

Figure 14A:
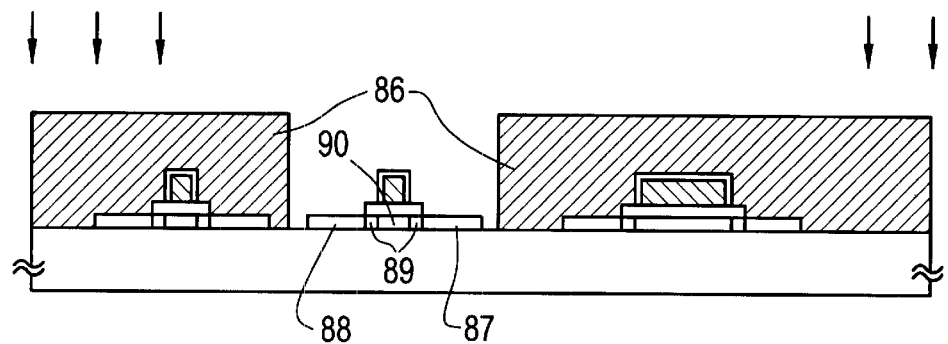
FIGS. 14A to 14C are views showing manufacturing steps of an active matrix substrate.

In this way, a source region 87, a drain region 88, a low concentration impurity region 89, and a channel formation region 90 for constituting the CMOS circuit are formed (FIG. 14A).

After the active layer is completed in the manner described above, activation of impurity ions is carried out by a combination of furnace annealing, laser annealing, lamp annealing, and the like. At the same time, damages of the active layer caused at the addition step are also repaired.

Figure 14B:
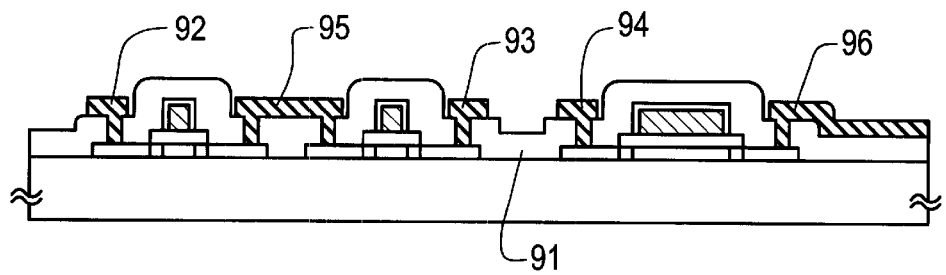

Next, a lamination film of a silicon oxide film and a silicon nitride film is formed as an interlayer insulating film 91, and after contact holes are formed, source electrodes 92 to 94, and drain electrodes 95 and 96 are formed to obtain the state shown in FIG. 14B.

In this embodiment, since a drain electrode 96 of the pixel TFT is used as a lower electrode of an auxiliary capacitance, the electrode is shaped to conform it.

Next, a silicon nitride film 97 with a thickness of 10 to 50 nm is formed, and a capacitance electrode 98 for forming the auxiliary capacitance is formed thereon to have a thickness of 100 nm. In this embodiment, a titanium film is used as the capacitance electrode 98 to form the auxiliary capacitance between the electrode 98 and the drain electrode 96.

Since the foregoing silicon nitride film 97 has a high relative dielectric constant, it is preferable as a dielectric. An aluminum film, a chromium film or the like may be used as the capacitance electrode 98 other than the titanium film.

In this embodiment, since an active matrix substrate (TFT side substrate) of a reflection type liquid crystal display device is manufactured, the portion under a subsequently formed pixel electrode can be freely used contrary to a transmission type (it is not necessary to pay attention to the opening rate). Therefore, it becomes possible to form the auxiliary capacitance as described above.

Next, a second interlayer insulating film 99 made of an organic resin film and having a thickness of 0.5 to 3 μm is formed. Then a conductive film is formed on the interlayer insulating film 99, and a pixel electrode 100 is formed by patterning. Since this embodiment relates to a reflection type, a material mainly composed of aluminum is used as a conductive film for constituting the pixel electrode, and the pixel electrode 100 is made to have a function as a reflection film.

Next, the entire of the substrate is heated in a hydrogen atmosphere at a temperature of 350° C. for 1 to 2 hours to hydrogenate the entire of the device, so that the dangling bonds (unpaired bonds) in the film (especially in the active layer) are compensated. Through the above steps, it is possible to form the CMOS circuit and the pixel matrix circuit on the same substrate.

Embodiment 7

In this embodiment, an example in which a TFT structure different from the embodiment 6 is adopted, will be described. First, FIG. 15A shows an example in which a side wall is used when a low concentration impurity region is formed.

In this case, in the state shown in FIG. 13A, a nonporous anodic oxidation film is formed, and a gate insulating film is etched by using a gate electrode and the anodic oxidation film as masks. In this state, impurity addition is carried out to form an $n^-$ region and a $p^-$ region.

Next, after side walls 1001 to 1003 are formed by an etch-back method, impurities are added to form an $n^+$ region and a $p^+$ region. In such steps, low concentration impurity regions ($n^-$ region and $p^-$ region) are formed under the side walls 1001 to 1003.

Figure 15A:
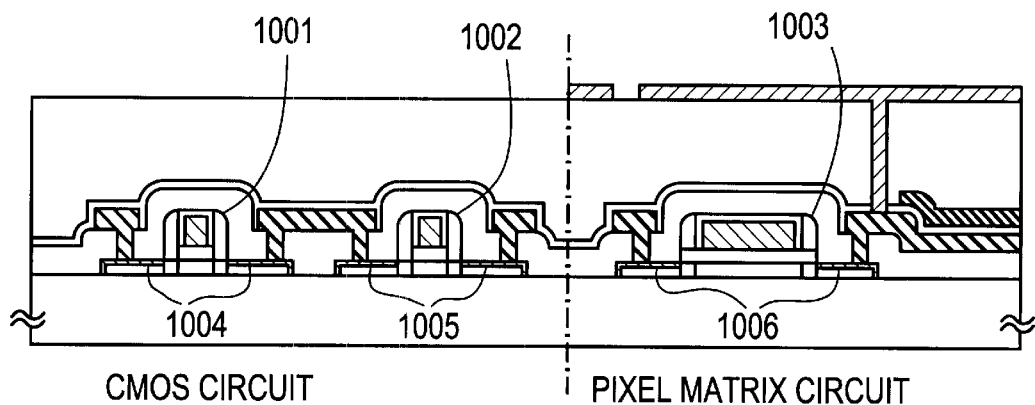
FIGS. 15A and 15B are views showing the structure of an active matrix substrate.

In FIG. 15A, metal silicides 1004 to 1006 are formed by a well-known saliside technique. Titanium, tantalum, tungsten, molybdenum, and the like may be used as metal for silicidfication.

Figure 15B:
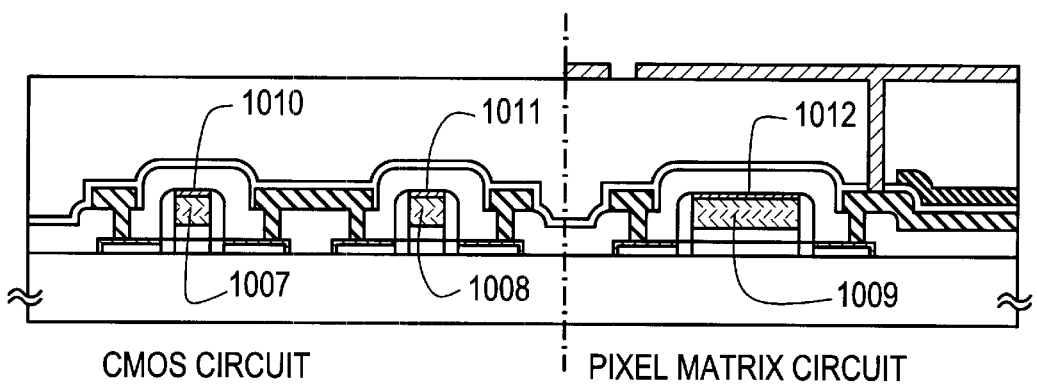

The structure shown in FIG. 15B has a feature that the gate electrodes 1007 to 1009 are formed of crystalline silicon films to which one conductivity is given. In general, although N-type conductivity is given, it is also possible to make a dual gate TFT in which conductivity is made different between the N-type TFT and P-type TFT.

Further, although the salicide structure is applied also to the structure shown in FIG. 15B, in this case, metal silicides 1010 to 1012 are formed also on the upper surfaces of the gate electrodes 1007 to 1009.

The structure shown in this embodiment is designed so that it is suitable for a TFT having a high speed operation. Especially, the salicide structure is an extremely effective technique for realizing an operation frequency of several GHz.

Embodiment 8

In this embodiment, an example in which an auxiliary capacitance with a structure different from the embodiment 6 is formed, will be described.

Figure 16A:
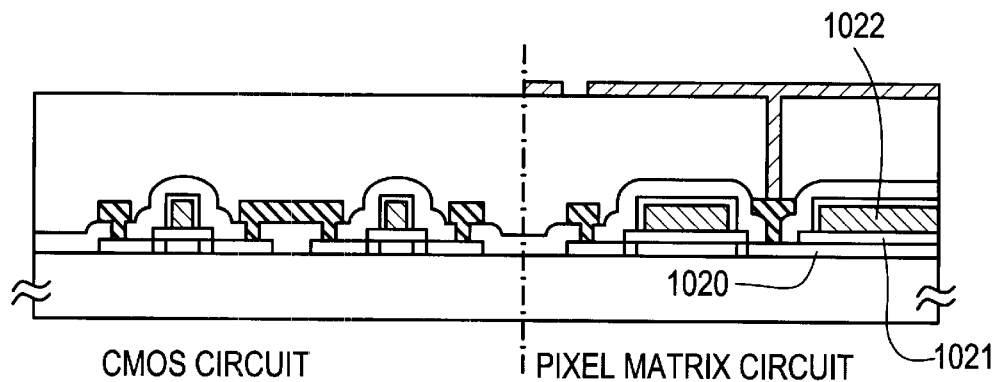
FIGS. 16A and 16B are views showing the structure of an active matrix substrate.

First, in FIG. 16A, a largish drain region 1020 of an active layer is formed, and a part thereof is positively used as a lower electrode of the auxiliary capacitance. In this case, a gate insulating film 1021 is disposed on the drain region 1020, and a capacitance electrode 1022 is formed thereon. This capacitance electrode 1022 is made of the same material as the gate electrode.

At this time, in the drain region 1020, the portion where the auxiliary capacitance is to be formed may have conductivity in advance by adding impurities, or an inversion layer formed by application of a constant voltage to the capacitance electrode 1022 may be used.

Since FIG. 16A relates to an example of a reflection type liquid crystal display device, the auxiliary capacitance can be formed by positively using the rear side of the pixel electrode to the utmost degree. Thus, extremely large capacitance can be secured. of course, although the invention can be applied to a transmission type liquid crystal display device, in this case, care must be paid since if an occupied area of the auxiliary capacitance is made large, the opening rate is lowered.

Figure 16B:
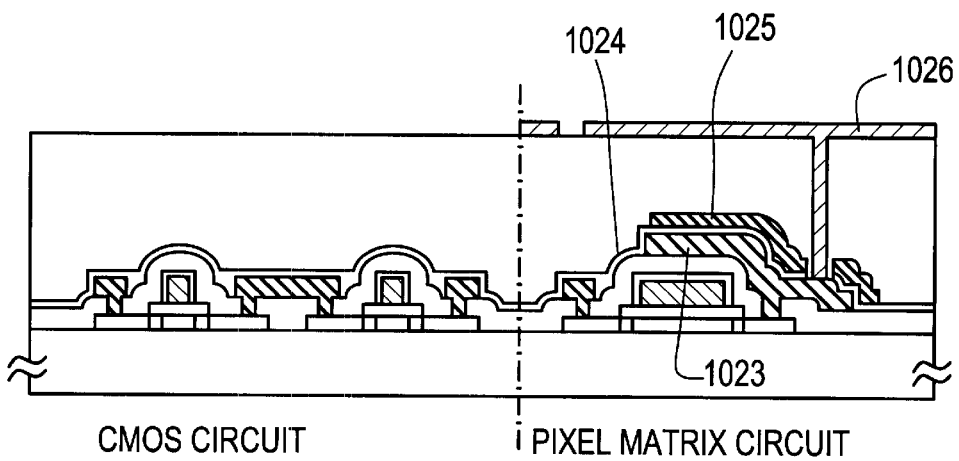

Next, FIG. 16B shows an example of a transmission type liquid crystal display device. In the structure of FIG. 16B, a drain electrode 1023 is made a lower electrode of the auxiliary capacitance, and a silicon nitride film 1024 and a black mask 1025 are formed thereon, so that the auxiliary capacitance is formed between the drain electrode 1023 and the black mask 1025. Like this, the structure of FIG. 16B has a feature that the black mask 1025 serves also as an upper electrode of the auxiliary capacitance.

Reference numeral 1026 denotes a pixel electrode and a transparent conductive film (for example, ITO film) is used because of the transmission type.

In the structure shown in FIG. 16B, it is possible to widen the opening rate by forming the auxiliary capacitance, which is apt to occupy a wide area, on the TFT. Moreover, since it is possible to use a silicon nitride film having high dielectric constant and a thickness of about 25 nm, it is possible to secure large capacitance with a small area.

Embodiment 9

Figure 17:
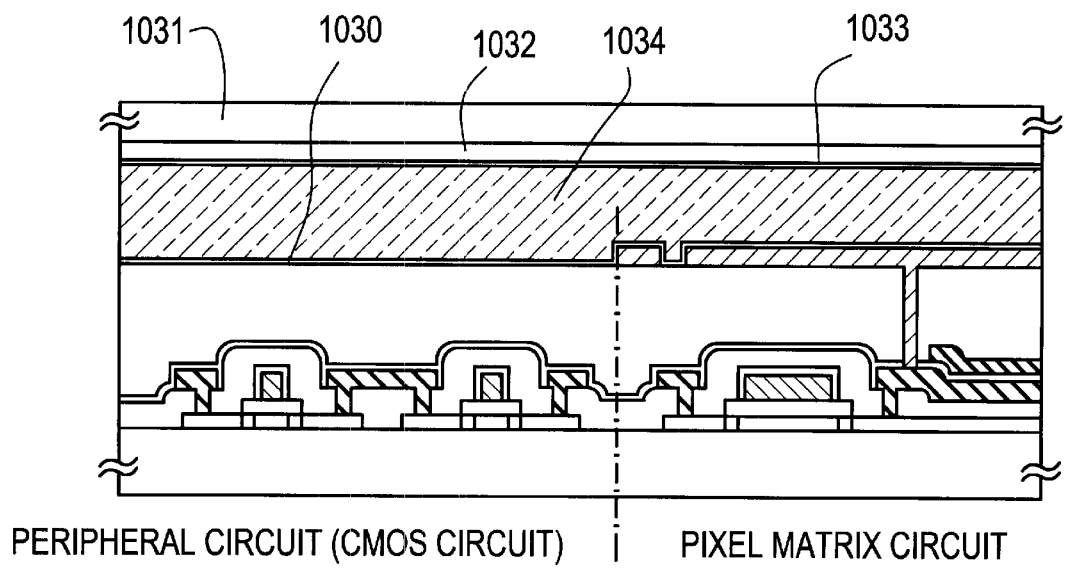
FIG. 17 is a view showing the section of a liquid crystal display device.

In this embodiment, an example in which a liquid crystal panel is formed by using the present invention will be described. FIG. 17 is a schematic view showing a section of an active matrix type liquid crystal panel, and shows a CMOS circuit in the region where a driver circuit and a logic circuit are formed, and a pixel TFT in the region where a pixel matrix circuit is formed.

Since the structure (TFT structure) of the CMOS circuit and the pixel matrix circuit has been described in the embodiments 6 to 8, only necessary portions will be described in this embodiment.

Figure 14C:
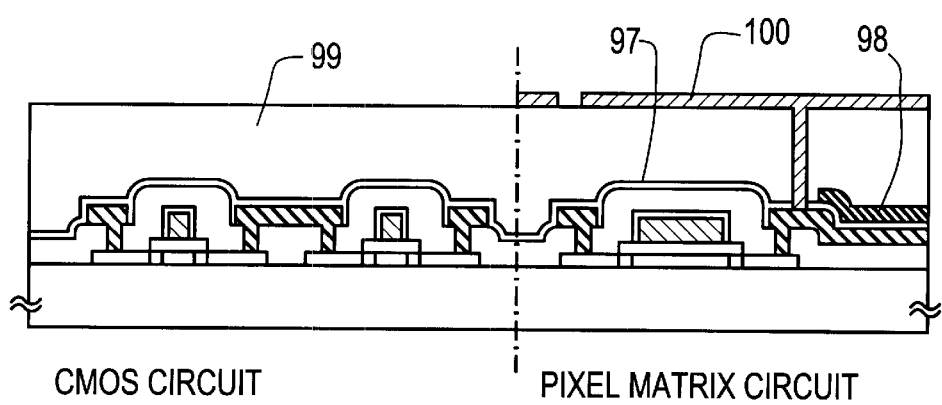

First, in accordance with the manufacturing steps shown in the embodiment 6, the state shown in FIG. 14C is obtained. Incidentally, a user may freely change a structure, for example, the pixel TFT may be formed into a multigate structure.

Then as the preparation for an active matrix substrate, an oriented film 1030 is formed. Next, an opposite substrate is prepared. The opposite substrate is constituted by a glass substrate 1031, a transparent conductive film 1032, and an oriented film 1033. Although a black mask or a color filter is formed according to necessity at the opposite substrate side, they are omitted here.

The active matrix substrate and the opposite substrate prepared in this way are bonded to each other through a well-known cell assembling step. Then a liquid crystal material 1034 is filled into a space between both the substrates, so that a liquid crystal panel as shown in FIG. 17 is completed.

The liquid crystal material 1034 can be freely selected according to an operation mode (ECB mode, guest-host mode, etc.) of the liquid crystal.

Figure 18:
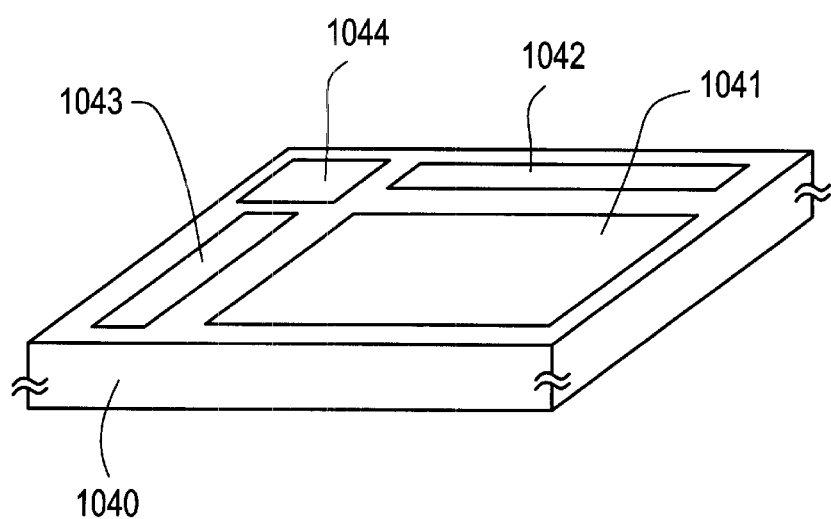
FIG. 18 is a view of an active matrix substrate seen from the above.

FIG. 18 schematically shows the outer appearance of an active matrix substrate as shown in FIG. 14C. In FIG. 18, reference numeral 1040 denotes a quartz substrate, 1041 denotes a pixel matrix circuit, 1042 denotes a source driver circuit, 1043 denotes a gate driver circuit, and 1044 denotes a logic circuit.

Although the logic circuit 1044 includes all logical circuits constituted by TFTs in a wide sense, in order to differentiate it from a circuit conventionally referred to as a pixel matrix circuit and a driver circuit, the logic circuit 1044 indicates a signal processing circuit (memory, D/A converter, pulse generator, etc.) other than those.

An FPC (Flexible Print Circuit) terminal as an external terminal is attached to the thus formed liquid crystal panel. In general, a so-called liquid crystal module is a liquid crystal panel in the state in which the FPC is attached.

Embodiment 10

Other than the liquid crystal display device shown in the embodiment 9, the present invention can be applied to manufacturing of other electrooptical devices such as an active matrix type EL (Electroluminescence) display device or EC (Electrochromics) display device.

Embodiment 11

FIGS. 19A to 19F shows examples of electronic devices (applied products) using an electrooptical device which employs the present invention. As the applied products employing the present invention, a video camera, a still camera, a projector, a head mount display, a car navigation system, a personal computer, a portable information terminal (mobile computer, portable telephone, etc.) may be enumerated.

FIG. 19A shows a portable telephone which is constituted by a main body 2001, an audio output portion 2002, an audio input portion 2003, a display device 2004, an operation switch 2005, and an antenna 2006. The present invention can be applied to the display device 2004.

FIG. 19B shows a video camera which is constituted by a main body 2101, a display device 2102, an audio input portion 2103, an operation switch 2104, a battery 2105, and an image receiving portion 2106. The present invention can be applied to the display device 2102.

FIG. 19C shows a mobile computer which is constituted by a main body 2201, a camera portion 2202, an image receiving portion 2203, an operation switch 2204, and a display device 2205. The present invention can be applied to the display device 2205.

FIG. 19D shows a head mount display which is constituted by a main body 2301, a display device 2302, and a band portion 2303. The present invention can be applied to the display device 2302.

FIG. 19E shows a rear type projector which is constituted by a main body 2401, an optical source 2402, a display device 2403, a polarizing beam splitter 2404, reflectors 2405, 2406, and a screen 2407. The present invention can be applied to the display device 2403.

FIG. 19F shows a front type projector which is constituted by a main body 2501, a light source 2502, a display device 2503, an optical system 2504, and a screen 2505. The present invention can be applied to the display device 2503.

As described above, the range of application of the present invention is extremely wide, and the invention can be applied to a display medium of any field. Moreover, since the TFT of the present invention can constitute a semiconductor circuit such as an IC and an LSI, the field of use thereof does not matter if a product requires such a semiconductor circuit.

As described above, according to the present invention, it is possible to realize a semiconductor thin film having crystallinity substantially comparable to single crystal semiconductor. By using such a semiconductor thin film, it is possible to realize a TFT having high performance comparable to or superior to an IGFET (MOSFET) formed on the single crystal.

A semiconductor circuit and an electrooptical device which are constituted by using the above described TFTs, and an electronic device equipped with those, have extremely high performance, and become extremely excellent in functionality, portability, and reliability.

What is claimed is:

1. An insulated gate semiconductor device comprising a channel formation region which is made of a semiconductor thin film constituted by an aggregate of a plurality of rod-like or flattened rod-ike crystals mainly composed of silicon, wherein:
    the semiconductor thin film has substantially plane orientation of {110}, and
    the concentration C (carbon), N (nitrogen), and S (sulfur) existing in the film is less than $5 \times 10^{18}$ atoms/cm$^3$, and the concentration of O (oxygen) existing in the film is less than $1.5 \times 10^{19}$ atoms/cm$^3$.

2. A device according to claim 1, wherein the plurality of rod-like or flattened rod-like crystals are crystal-grown with a head of a {111} plane substantially along a <111> axis direction.

3. A device according to claim 1, wherein the plurality of rod-like or flattened rod-like crystals are arranged side by side substantially in parallel to each other with specific directionality.

4. A device according to claim 1, wherein almost all lattice stripes observed to cross an arbitrary crystal grain boundary of the semiconductor thin film are linearly continuous between different crystal grains forming the crystal grain boundary.

5. A device according to claim 1, wherein almost all crystal lattices have continuity in any crystal grain boundary of the semiconductor thin film.

6. A device according to claim 1, wherein specific regularity due to the {110} orientation is observed in an electron beam diffraction pattern of the semiconductor thin film.

7. An insulated gate semiconductor device comprising a channel formation region which is made of a semiconductor thin film constituted by an aggregate of a plurality of rod-like or flattened rod-like crystals mainly composed of silicon, wherein:
    a ratio of {110} orientation of the semiconductor thin film is not smaller than 0.09,
    the concentration of C (carbon), N (nitrogen), and S (sulfur) existing in the film is less than $5 \times 10^{18}$ atoms/cm$^3$, and
    the concentration of O (oxygen) existing in the film is less than $1.5 \times 10^{19}$ atoms/cm$^3$.

8. A device according to claim 7, wherein the plurality of rod-like or flattened rod-like crystals are crystal-grown with a head of a {111} plane substantially along a <111> axis direction.

9. A device according to claim 7, wherein the plurality of rod-like or flattened rod-like crystals are arranged side by side substantially in parallel to each other with specific directionality.

10. A device according to claim 7, wherein almost all lattice stripes observed to cross an arbitrary crystal grain boundary of the semiconductor thin film are linearly continuous between different crystal grains forming the crystal grain boundary.

11. A device according to claim 7, wherein almost all crystal lattices have continuity in any crystal grain boundary of the semiconductor thin film.

12. A device according to claim 7, wherein specific regularity due to the {110} orientation is observed in an electron beam diffraction pattern of the semiconductor thin film.

13. An insulated gate semiconductor device comprising:
    a channel formation region which is made of a semiconductor thin film constituted by an aggregate of a plurality of rod-like or flattened rod-like crystals mainly composed of silicon;
    a drain region provided adjacent to the channel formation region; and
    a lightly doped drain region provided between the channel formation region and the drain region,
    wherein the semiconductor thin film has substantially plane orientation of {110}, and
    the concentration of C (carbon), N (nitrogen), and S (sulfur) existing in the film is less than $5 \times 10^{18}$ atoms/cm$^3$, and the concentration of O (oxygen) existing in the film is less than $1.5 \times 10^{19}$ atoms/cm$^3$.

14. An insulated gate semiconductor device comprising:
    a channel formation region which is made of a semiconductor thin film constituted by an aggregate of a plurality of rod-like or flattened rod-like crystals mainly composed of silicon;
    a drain region provided adjacent to the channel formation region; and
    a lightly doped drain region provided between the channel formation region and the drain region,
    wherein a ratio of {110} orientation of the semiconductor thin film is not smaller than 0.9, and
    the concentration of C (carbon), N (nitrogen), O (oxygen), and S (sulfur) existing in the film is lower than the lower detection limit of SIMS.

15. An insulated gate semiconductor device comprising:
    a channel formation region which is made of at least a semiconductor thin film constituted by an aggregate of a plurality of rod-like or flattened rod-like crystals mainly composed of silicon;
    a drain region provided adjacent to the channel formation region; and
    a lightly doped drain region provided between the channel formation region and the drain region, wherein:
    a ratio of {110} orientation of the semiconductor thin film is not smaller than 0.9,
    the concentration of C (carbon), N (nitrogen), and S (sulfur) existing in the film is less than $5 \times 10^{18}$ atoms/cm$^3$, and
    the concentration of O (oxygen) existing in the film is less than $1.5 \times 10^{19}$ atoms/cm$^3$.

16. A device according to claim 1 wherein said insulated gate semiconductor device is a liquid crystal display device.

17. A device according to claim 1 wherein said insulated gate semiconductor device is an electroluminescence display device.

18. A device according to claim 1 wherein said insulated gate semiconductor device is an electrochromics display device.

19. A device according to claim 1 wherein said semiconductor device is incorporated into a video camera, a still camera, a projector, a head mount display, a car navigation system, a personal computer, a portable information terminal, a mobile computer or a portable telephone.

20. A device according to claim 7 wherein said insulated gate semiconductor device is a liquid crystal display device.

21. A device according to claim 7 wherein said insulated gate semiconductor device is an electroluminescence display device.

22. A device according to claim 7 wherein said insulated gate semiconductor device is an electrochromics display device.

23. A device according to claim 7 wherein said semiconductor device is incorporated into a video camera, a still camera, a projector, a head mount display, a car navigation system, a personal computer, a portable information terminal, a mobile computer or a portable telephone.

24. An insulated gate semiconductor device comprising:
a channel formation region which is made of a semiconductor thin film constituted by an aggregate of a plurality of rod-like or flattened rod-like crystals mainly composed of silicon; and
a gate insulating film provided adjacent to said channel formation region and comprising a terminal oxide at an interface between said channel formation region and said gate insulating film,
wherein the semiconductor thin film has substantially plane orientation of ({110}, and
wherein the concentration of C (carbon), N (nitrogen), and S (sulfur) existing in the film is less than $5 \times 10^{18}$ atoms/cm$^3$, and the concentration of O (oxygen) existing in the film is less than $1.5 \times 10^{19}$ atoms/cm$^3$.

25. An insulated gate semiconductor device comprising a channel formation region which is made of a semiconductor thin film having a lateral growth region,
wherein the semiconductor thin film has substantially plane orientation of {110}, and
wherein the concentration of C (carbon), N (nitrogen), and S (sulfur) existing in the film is less than $5 \times 10^{18}$ atoms/cm$^3$, and the concentration of O (oxygen) existing in the film is less than $1.5 \times 10^{19}$ atoms/cm$^3$.

26. An insulated gate semiconductor device comprising:
a channel formation region which is made of at least a semiconductor thin film constituted by an aggregate of a plurality of rod-like or flattened rod-like crystals mainly composed of silicon; and
a gate insulating film provided adjacent to said channel formation region and comprising a thermal oxide at an interface between said channel formation region and said gate insulating film,
wherein a ratio of {110} orientation of the semiconductor thin film is not smaller than 0.9,
wherein the concentration of C (carbon), N (nitrogen), and S (sulfur) existing in the film is less than $5 \times 10^{18}$ atoms/cm$^3$, and the concentration of O (oxygen) existing in the film is less than $1.5 \times 10^{19}$ atoms/cm$^3$.

27. An insulated gate semiconductor device comprising a channel formation region which is made of a semiconductor thin film having a lateral growth region,
wherein the semiconductor thin film has substantially plane orientation of {110}, and
wherein the concentration of C (carbon), N (nitrogen), and S (sulfur) existing in the film is less than $5 \times 10^{18}$ atoms/cm$^3$, and the concentration of O (oxygen) existing in the film is less than $1.5 \times 10$ atoms/cm$^3$.

28. An insulated gate semiconductor device comprising:
a channel formation region which is made of a semiconductor thin film constituted by an aggregate of a plurality of rod-like or flattened rod-like crystals mainly composed of silicon;
a gate insulating film provided adjacent to said channel formation region and comprising a thermal oxide at an interface between said channel formation region and said gate insulating film;
a drain region provided adjacent to the channel formation region; and
a lightly doped drain region provided between the channel formation region and the drain region,
wherein the semiconductor thin film has substantially plane orientation of {110}, and
the concentration of C (carbon), N (nitrogen), and S (sulfur) existing in the film is less than $5 \times 10^{18}$ atoms/cm$^3$, and the concentration of O (oxygen) existing in the film is less than $1.5 \times 10^{19}$ atoms/cm$^3$.

29. An insulated gate semiconductor device comprising:
a channel formation region which is made of a semiconductor thin film having a lateral growth region;
a drain region provided adjacent to the channel formation region; and
a lightly doped drain region provided between the channel formation region and the drain region,
wherein the semiconductor thin film has substantially plane orientation of {110}, and
the concentration of C (carbon), N (nitrogen), and S (sulfur) existing in the film is less than $5 \times 10^{18}$ atoms/cm$^3$, and the concentration of O (oxygen) existing in the film is less than $1.5 \times 10^{19}$ atoms/cm$^3$.

30. An insulated gate semiconductor device comprising:
a channel formation region which is made of at least a semiconductor thin film constituted by an aggregate of a plurality of rod-like or flattened rod-like crystals mainly composed of silicon;
a gate insulating film provided adjacent to said channel formation region and comprising a thermal oxide at an interface between said channel formation region and said gate insulating film;
a drain region provided adjacent to the channel formation region; and
a lightly doped drain region provided between the channel formation region and the drain region, wherein:
a ratio of {110} orientation of the semiconductor thin film is not smaller than 0.9,
the concentration of C (carbon), N (nitrogen), and S (sulfur) existing in the film is less than $5 \times 10^{18}$ atoms/cm$^3$, and
the concentration of O (oxygen) existing in the film is less than $1.5 \times 10^{19}$ atoms/cm$^3$.

31. An insulated gate semiconductor device comprising:
a channel formation region which is made of at least a semiconductor thin film having a lateral growth region;
a drain region provided adjacent to the channel formation region; and
a lightly doped drain region provided between the channel formation region and the drain region, wherein:
a ratio of {110} orientation of the semiconductor thin film is not smaller than 0.9,
the concentration of C (carbon), N (nitrogen), and S (sulfur) existing in the film is less than $5 \times 10^{18}$ atoms/cm$^3$, and the concentration of O (oxygen) existing in the film is less than $1.5 \times 10^{19}$ atoms/cm$^3$.

32. The semiconductor device of claim 1, wherein the concentration of C (carbon), N (nitrogen), and S (sulfur) existing in the film is less than 0.01 atomic %, and the concentration of O (oxygen) existing in the film is less than 0.03 atomic %.

33. The semiconductor device of claim 7, wherein the concentration of C (carbon), N (nitrogen), and S (sulfur) existing in the film is less than 0.01 atomic %, and the concentration of O (oxygen) existing in the film is less than 0.03 atomic %.

34. The semiconductor device of claim 13, wherein the concentration of C (carbon), N (nitrogen), and S (sulfur) existing in the film is less than 0.01 atomic %, and the concentration of O (oxygen) existing in the film is less than 0.03 atomic %.

35. The semiconductor device of claim 15, wherein the concentration of C (carbon), N (nitrogen), and S (sulfur) existing in the film is less than 0.01 atomic %, and the concentration of O (oxygen) existing in the film is less than 0.03 atomic %.

36. The semiconductor device of claim 24, wherein wherein the concentration of C (carbon), N (nitrogen), and S (sulfur) existing in the film is less than 0.01 atomic %, and the concentration of O (oxygen) existing in the film is less than 0.03 atomic %.

37. The semiconductor device of claim 25, wherein wherein the concentration of C (carbon), N (nitrogen), and S (sulfur) existing in the film is less than 0.01 atomic %, and the concentration of O (oxygen) existing in the film is less than 0.03 atomic %.

38. The semiconductor device of claim 26, wherein wherein the concentration of C (carbon), N (nitrogen), and S (sulfur) existing in the film is less than 0.01 atomic %, and the concentration of O (oxygen) existing in the film is less than 0.03 atomic %.

39. The semiconductor device of claim 27, wherein wherein the concentration of C (carbon), N (nitrogen), and S (sulfur) existing in the film is less than 0.01 atomic %, and the concentration of O (oxygen) existing in the film is less than 0.03 atomic %.

40. The semiconductor device of claim 28, wherein the concentration of C (carbon), N (nitrogen), and S (sulfur) existing in the film is less than 0.01 atomic %, and the concentration of O (oxygen) existing in the film is less than 0.03 atomic %.

41. The semiconductor device of claim 29, wherein the concentration of C (carbon), N (nitrogen), and S (sulfur) existing in the film is less than 0.01 atomic %, and the concentration of O (oxygen) existing in the film is less than 0.03 atomic %.

42. The semiconductor device of claim 30, wherein the concentration of C (carbon), N (nitrogen), and S (sulfur) existing in the film is less than 0.01 atomic %, and the concentration of O (oxygen) existing in the film is less than 0.03 atomic %.

43. The semiconductor device of claim 31, wherein the concentration of C (carbon), N (nitrogen), and S (sulfur) existing in the film is less than 0.01 atomic %, and the concentration of O (oxygen) existing in the film is less than 0.03 atomic %.

* * * * *